US008804426B2

(12) United States Patent
Aritome

(10) Patent No.: US 8,804,426 B2
(45) Date of Patent: Aug. 12, 2014

(54) METHODS OF OPERATING SEMICONDUCTOR DEVICE

(75) Inventor: Seiichi Aritome, Seongnam (KR)

(73) Assignee: SK Hynix Inc., Gyeonggi-do (KR)

( * ) Notice: Subject to any disclaimer, the term of this patent is extended or adjusted under 35 U.S.C. 154(b) by 179 days.

(21) Appl. No.: 13/542,487

(22) Filed: Jul. 5, 2012

(65) Prior Publication Data

US 2013/0010549 A1 Jan. 10, 2013

(30) Foreign Application Priority Data

Jul. 6, 2011 (KR) ........................ 10-2011-0067012
Jun. 26, 2012 (KR) ........................ 10-2012-0068537

(51) Int. Cl.
*G11C 16/04* (2006.01)

(52) U.S. Cl.
CPC .................................. *G11C 16/0483* (2013.01)
USPC ................................ 365/185.17; 365/185.28

(58) Field of Classification Search
CPC ................................................... G11C 16/0483
USPC ........................... 364/185.17, 185.28, 185.18
See application file for complete search history.

(56) References Cited

U.S. PATENT DOCUMENTS 7,471,565 B2 12/2008 Aritome
7,511,995 B2 * 3/2009 Oowada .................. 365/185.02
7,561,469 B2 7/2009 Aritome
2009/0147571 A1 * 6/2009 Oowada .................. 365/185.02

* cited by examiner

*Primary Examiner* — Vu Le
(74) *Attorney, Agent, or Firm* — William Park & Associates Patent Ltd.

(57) ABSTRACT

A method of operating a semiconductor device according to an embodiment of the present invention includes programming selected memory cells by applying a first program voltage, which gradually rises, to a selected word line and applying a first pass voltage, which is constant, to remaining unselected word lines; and programming the selected memory cells while applying a second program voltage, which is constant, to the selected word line and applying a second pass voltage, which gradually rises, to first unselected word lines adjacent to the selected word line, when a difference between the first program voltage and the first pass voltage reaches a critical voltage difference.

14 Claims, 7 Drawing Sheets

110
150
160
170
ST
DSL
SSL
CSL
DST
SST
BLe
BLo
PB
CL
Column selector
DL
I/O circuit
DATA
P/F check circuit
180
PFS
CS
Voltage generator
130
Vpgm,Vpass
Vread
Row decoder
140
READ, PGM, ERASE
RADD
PB SIGNALS
CADD
Comparator
200
Vpgm, Vpass
CV
Controller
120
CMD,ADD

METHODS OF OPERATING SEMICONDUCTOR DEVICE

CROSS-REFERENCE TO RELATED APPLICATION

The present application claims priority to Korean patent application numbers 10-2011-0067012 filed on Jul. 6, 2011, and 10-2012-0068537 filed on Jun. 26, 2012, the entire disclosure of which is incorporated herein by reference in its entirety.

BACKGROUND

Embodiments of this invention relate generally to methods of operating a semiconductor device and, more particularly to program methods of a semiconductor device.

A semiconductor device includes a memory cell array in which data is stored. The memory cell array includes a plurality of cell blocks. Each of the cell blocks includes a plurality of cell strings. The cell strings have the same structure, and only one of the cell strings is described below in detail.

FIG. 1 is a sectional view of a cell string for illustrating known phenomenon.

Referring to FIG. 1, the cell string includes a plurality of memory cells and switching elements which are formed over a semiconductor substrate 10. The switching elements comprise a drain select transistor and a source select transistor. In case of a NAND flash memory device, the plurality of memory cells is formed, for example, between the drain select transistor and the source select transistor, and a junction 11 is formed in the semiconductor substrate 10 between the transistors and the respective memory cells. Each of the drain and source select transistors includes a gate insulating layer 12 and a gate electrode 14 which are sequentially stacked over the semiconductor substrate 10. Each of the memory cells includes the gate insulating layer 12, a floating gate 16, a dielectric layer 17, and a control gate 18 which are sequentially stacked over the semiconductor substrate 10. The gate insulating layer 12 is made of an insulating material, such as an oxide layer. The dielectric layer 17 may have a stack structure including an oxide layer, a nitride layer, and an oxide layer, or it may be made of a high-k material. The floating gate 16, the control gate 18, and the gate electrode 14 are made of a conductive material, such as polysilicon. The drain select transistors included in different cell strings are coupled to a drain select line DSL, the source select transistors included in different cell strings are coupled to a source select line SSL, and the memory cells included in different cell strings are coupled to respective word lines WLn−k to WLn+k.

A method of programming a semiconductor memory device including the cell string is described below.

Referring to FIGS. 1 and 2, a program permission voltage (for example, a ground voltage) is applied to the channel of a selected cell string (it is hereinafter assumed that the cell string of FIG. 1 has been selected), a program voltage Vpgm is applied to a selected word line (for example, WLn) coupled to a selected memory cell, and a pass voltage Vpass is applied to the remaining unselected word lines WLn−k to WLn−1 and WLn+1 to WLn+k. When the program voltage Vpgm is applied to the selected word line WLn, the potential of the floating gate 16 rises owing to coupling between the control gate 18 and the floating gate 16. As a result, electrons within the semiconductor substrate 10 are introduced into the floating gate 16 through the gate insulating layer 12 because of a tunneling phenomenon. An operation in which the electrons are introduced into the floating gate 16 is called a program operation. In contrast, an operation in which electrons in the floating date 16, for example, electrons introduced into the floating gate 16 are drained out to the semiconductor substrate 10 is called an erase operation.

Recently, a multi-level cell (MLC) method of programming one memory cell in various levels is chiefly used. In order to program one memory cell in various levels, the distribution widths of the threshold voltages of memory cells must be narrow. To this end, a program operation using an Incremental Step Pulse Program (hereinafter referred to as an 'ISPP') method is used.

A program operation using an ISPP method is performed by applying the program voltage Vpgm to the selected word line WLn and applying the pass voltage Vpass to the remaining unselected word lines WLn−k to WLn−1 and WLn+1 to WLn+k. In general, the pass voltage Vpass has a level lower than the program voltage Vpgm. More particularly, the program voltage Vpgm having a low level is applied at the early stage of program, and the program voltage Vpgm is raised by a step voltage. After the program voltage Vpgm and the pass voltage Vpass are applied, a verify operation for determining whether the threshold voltage of the selected memory cell has reached a target voltage is performed. If, as a result of the verify operation, the threshold voltage of the selected memory cell is determined not to have reached the target voltage, the program operation and the verify operation are repeated by applying the program voltage Vpgm and the pass voltage Vpass while gradually raising the program voltage Vpgm by the step voltage until the threshold voltage of the selected memory cell reaches the target voltage. If, as a result of the verify operation, the threshold voltage of the selected memory cell is determined to have reached the target voltage, the program operation is terminated.

While the program operation is performed, the program voltage Vpgm gradually rises, whereas the pass voltage Vpass (1) having a constant level is applied to the remaining unselected word lines WLn−k to WLn−1 and WLn+1 to WLn+k. Accordingly, a difference between the program voltage Vpgm and the pass voltage Vpass gradually increases. Furthermore, while the program operation is performed, whereas an increasing pass voltage Vpass(2) is applied to the remaining unselected word lines WLn−k to WLn−1 and WLn+1 to WLn+k. The increasing pass voltage Vpass(2) increases as a step-up level lower than that of the program voltage Vpgm. In case of unselected memory cells adjacent to the selected memory cell, if the program voltage Vpgm applied to the selected word line WLn becomes higher than a specific level, the unselected memory cells may be erased under the influence of the raised program voltage Vpgm of the adjacent selected memory cell. That is, if the program voltage Vpgm gradually rises and then voltage difference between the program voltage Vpgm and the pass voltage Vpass reaches a Critical voltage Difference (hereinafter referred to as a 'CD'), a breakdown BD between the unselected memory cells and the selected memory cells may be occurred. Furthermore, electrons which are stored in the floating gate 16 of the unselected memory cells adjacent to the selected memory cell may be ejected to the control gate 18 of the selected memory cell, and so the threshold voltages of the unselected memory cells may be decreased As described above, when the program voltage Vpgm applied to the selected word line WLn in the program operation gradually rises and thus a difference between the program voltage Vpgm and the pass voltage Vpgm reaches the CD, the threshold voltages of unselected memory cells adjacent to the selected memory cell may be shifted, and the reliability of the program operation may deteriorate.

BRIEF SUMMARY

In accordance with an exemplary embodiment of this invention, a difference between a program voltage and a pass voltage is prevented from rising higher than a critical voltage difference (CD) in a program operation in order to prevent unselected memory cells adjacent to a selected memory cell from being erased.

Furthermore, a program voltage, which has gradually risen, remains constant after reaching a specific level in order to prevent leakage that may occur in a selected memory cell.

A method of operating a semiconductor device according to an embodiment of the present invention includes programming selected memory cells by applying a first program voltage, which gradually rises, to a selected word line and applying a first pass voltage, which is constant, to remaining unselected word lines; and programming the selected memory cells while applying a second program voltage, which is constant, to the selected word line and applying a second pass voltage, which gradually rises, to first unselected word lines adjacent to the selected word line, when a difference between the first program voltage and the first pass voltage reaches a critical voltage difference.

The method further includes programming the selected memory cells while applying a third pass voltage, having a lower potential than the first pass voltage by the critical voltage difference, to second unselected word lines adjacent to the first unselected word lines, respectively, when applying the second pass voltage to the first unselected word lines.

The third pass voltage gradually rises in proportion to the second pass voltage.

The method further includes applying a fourth pass voltage, which gradually drops, to second unselected word lines adjacent to the first unselected word lines, respectively, when applying the second pass voltage to the first unselected word lines; and applying a fifth pass voltage, gradually rising in proportion to the second pass voltage, to the second unselected word lines, when a difference between the fourth pass voltage and the second pass voltage reaches the critical voltage difference.

The method further includes applying a sixth pass voltage, which gradually drops, to third unselected word lines adjacent to the second unselected word lines, respectively, when applying the fifth pass voltage to the second unselected word lines; and applying a seventh pass voltage which is constant to the second unselected word lines, when a difference between the sixth pass voltage and the first pass voltage reaches the critical voltage difference.

The method further includes applying a fourth pass voltage which gradually drops to second and third unselected word lines sequentially adjacent to the first unselected word lines, when applying the second pass voltage to the first unselected word lines; and applying a fifth pass voltage, gradually rising in proportion to the second pass voltage, to the second unselected word lines, and continuing to apply the fourth pass voltage to the third unselected word lines until a difference between the first pass voltage and the fourth pass voltage reaches the critical voltage difference, when a difference between the fourth pass voltage and the second pass voltage reaches the critical voltage difference.

The method further includes applying an eighth pass voltage, which is constant, to the second unselected word lines, when a difference between the first pass voltage and the fourth pass voltage applied to the third unselected word lines reaches the critical voltage difference.

A method of operating a semiconductor device according to an embodiment of the present invention includes programming selected memory cells coupled to a selected word line by applying a first program voltage, gradually rising by a first step voltage, to the selected word line and by applying a ninth pass voltage, gradually rising by a lower level than the first program voltage, to remaining unselected word lines; and programming the selected memory cells while applying a second program voltage, which is constant, to the selected word line and applying a second pass voltage, gradually rising by the first step voltage, to first unselected word lines adjacent to the selected word line, when a difference between the first program voltage and the ninth pass voltage reaches a critical voltage difference while programming the selected memory cells.

The method further includes applying a third pass voltage, having a lower potential than the ninth pass voltage by the critical voltage difference, to second unselected word lines adjacent to the first unselected word lines, respectively, when applying the second pass voltage to the first unselected word lines.

The third pass voltage gradually rises in proportion to the second pass voltage.

The method further includes applying a fourth pass voltage, which gradually drops, to second unselected word lines adjacent to the first unselected word lines, respectively, when applying the second pass voltage to the first unselected word lines; and applying a fifth pass voltage, gradually rising in proportion to the second pass voltage, to the second unselected word lines, when a difference between the fourth pass voltage and the second pass voltage reaches the critical voltage difference.

The method further includes applying a sixth pass voltage, which gradually drops, to third unselected word lines adjacent to the second unselected word lines, respectively, when applying the fifth pass voltage to the second unselected word lines; and applying a tenth pass voltage, gradually rising in proportion to the ninth pass voltage, to the third unselected word lines, when a difference between the sixth pass voltage and the ninth pass voltage reaches the critical voltage difference.

The method further includes applying a fourth pass voltage, which gradually drops, to second and third unselected word lines sequentially adjacent to the first unselected word lines, when applying the second pass voltage to the first unselected word lines; and applying a fifth pass voltage, gradually rising in proportion to the second pass voltage, to the second unselected word lines, and continuing to apply the fourth pass voltage to the third unselected word lines until a difference between the ninth pass voltage and the fourth pass voltage reaches the critical voltage difference, when a difference between the fourth pass voltage and the second pass voltage reaches the critical voltage difference.

The method further includes applying an eleventh pass voltage, gradually rising in proportion to the ninth pass voltage, to the third unselected word lines, when a difference between the ninth pass voltage and the fourth pass voltage applied to the third unselected word lines reaches the critical voltage difference.

DESCRIPTION OF EMBODIMENTS

Hereinafter, some exemplary embodiments of the present invention will be described in detail with reference to the accompanying drawings. The figures are provided to allow those having ordinary skill in the art to understand the scope of the embodiments of the invention.

Figure 1:
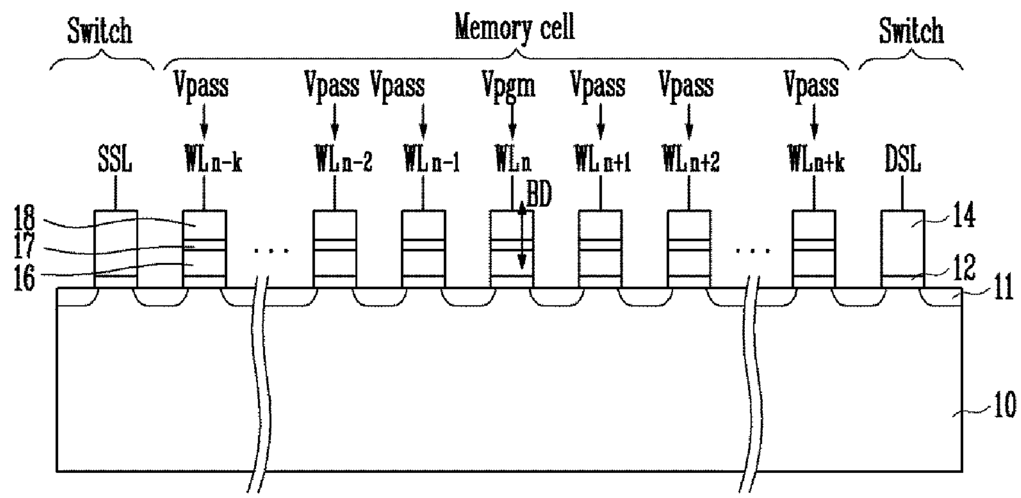
FIG. 1 is a sectional view of a cell string for illustrating known phenomenon.
Figure 2:
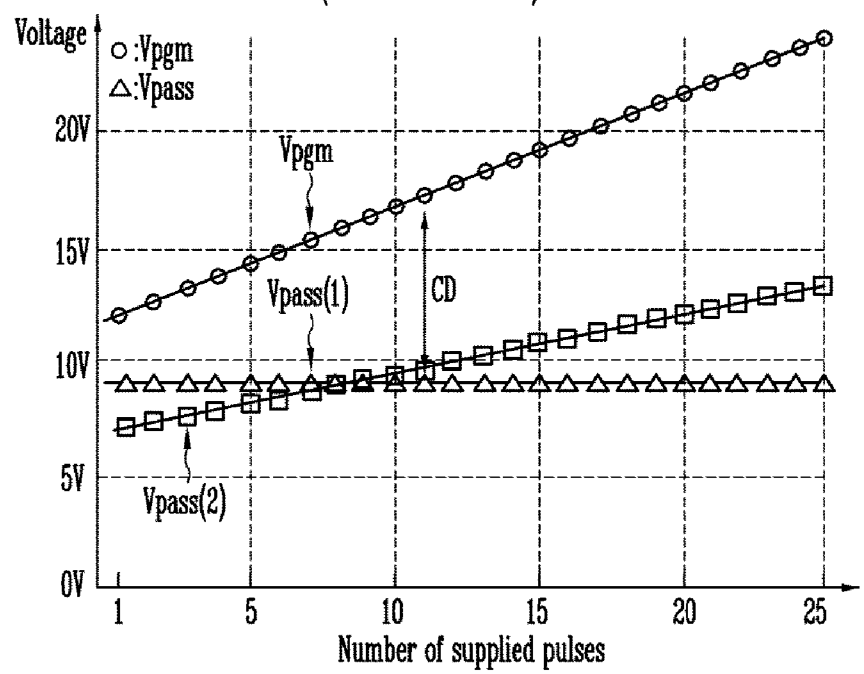
FIG. 2 is a graph illustrating a known program method.
Figure 3:
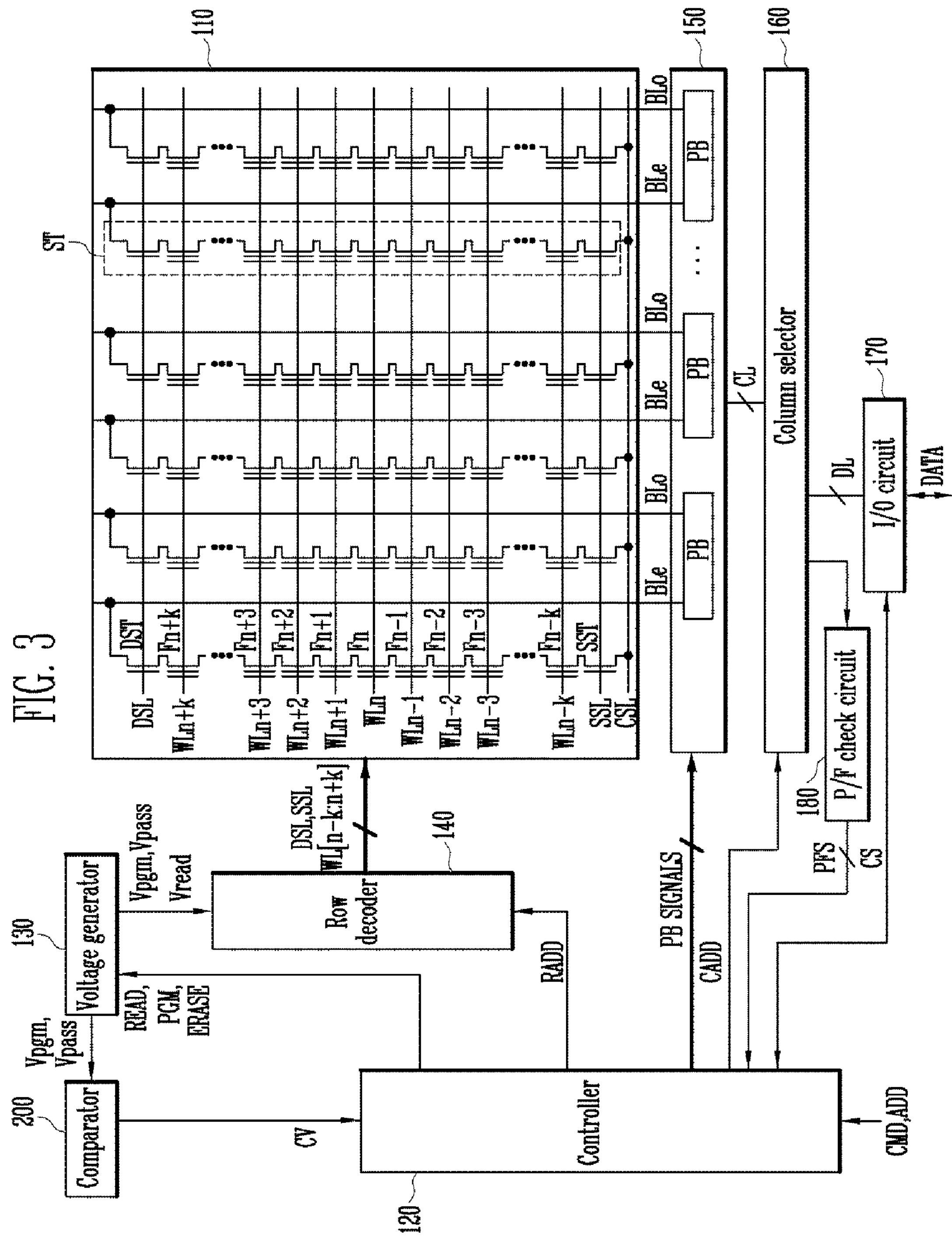
FIG. 3 is a block diagram illustrating a semiconductor device.

FIG. 3 is a block diagram illustrating a semiconductor device.

Referring to FIG. 3, the semiconductor device includes a memory cell array 110, a circuit group (e.g., 130, 140, 150, 160, 170, 180, and 200) configured to perform a program operation, a read operation, or an erase operation on memory cells included in the memory cell array 110, and a controller 120 configured to control the circuit group (e.g., 130, 140, 150, 160, 170, 180, and 200) in order to set the threshold voltage levels of selected memory cells based on input data.

In case of a NAND flash memory device, the circuit group includes a voltage generator 130, a row decoder 140, a page buffer group 150, a column selector 160, an I/O circuit 170, a Pass/Fail (P/F) check circuit 180, and a comparator 200.

The memory cell array 110 includes a plurality of memory cells coupled to word lines and bit lines. The memory cell array 110 is described in detail. The memory cell array 110 includes a plurality of cell blocks. Only one of the cell blocks is shown in FIG. 3, for example. The cell block includes a plurality of cell strings ST. Some of the cell strings ST are designated as normal strings, and some of the cell strings ST are designated as flag strings. The cell strings ST may have the same configuration. Each of the cell strings ST includes a source select transistor SST coupled to a common source line CSL, a plurality of memory cells Fn−k to Fn+k, and a drain select transistor DST coupled to each of bit line BLe or BLo. Memory cells included in the flag string are called flag cells, and they may have the same configuration as normal memory cells included in the normal strings. The gate of the source select transistor SST is coupled to a source select line SSL, the gates of the memory cells Fn−k to Fn+k are coupled to respective word lines WLn−k to WLn+k, and the gate of the drain select transistor DST is coupled to a drain select line DSL. The cell strings ST are coupled to respective bit lines BLe and BLo and are coupled to the common source line CSL in common.

The voltage supply circuit (e.g., 130 and 140) supplies voltages necessary for a program operation, a read operation, or an erase operation on the memory cells to the drain select line DSL, the word lines WLn−1 to WLn+m, the source select line SSL, and the well of a selected cell block in response to signals PGM, ERASE, READ, and RADD generated from the controller 120. The voltage supply circuit includes the voltage generator 130 and the row decoder 140.

The voltage generator 130 outputs operating pulses for programming, reading, or erasing memory cells to global lines in response to the operating signals PGM, READ, and ERASE, that is, the internal command signals of the controller 120 and also outputs operating pulses (for example, Vpgm, Vpass, and Vread) for program to the global lines when memory cells are programmed. Here, Vpgm denotes a program voltage, Vpass denotes a pass voltage, and Vread denotes a read pulse.

The row decoder 140 transfers the operating pulses of the voltage generator 130 to the local lines DSL, SSL, and WL[n−k:n+k] of a selected cell block in response to row address signals RADD generated from the controller 120.

The comparator 200 compares the program voltage Vpgm and the pass voltage Vpass generated from the voltage generator 130 in a program operation and generates a critical signal CV if, as a result of the comparison, a difference between the program voltage Vpgm and the pass voltage Vpass is a critical value or higher.

The page buffer group 150 detects the program state or the erase state of memory cells. The page buffer group 150 includes page buffers PB each coupled to the bit lines BLe and BLo and applies voltages necessary to store data in the memory cells Fn−k to Fn+k to the respective bit lines BLe and BLo in response to page buffer signals PB SIGNALS generated from the controller 120. More particularly, the page buffer group 150 precharges the bit lines BLe and BLo or latches data, corresponding to the threshold voltage levels of the memory cells Fn−k to Fn+k which are detected based on shifts in the voltages of the bit lines BLe and BLo, in a program operation, an erase operation, or a read operation on the memory cells Fn−k to Fn+k. That is, the page buffer group 150 applies a program permission voltage (for example, a ground voltage) or a program inhibition voltage (for example, a power source voltage) to the bit lines BLe or BLo based on data inputted to the latches in the program operation and detects data stored in the memory cells Fn−k to Fn+k by controlling the voltages of the bit lines BLe to BLo based on data stored in the memory cells Fn−k to Fn+k in the read operation. Furthermore, the page buffer group 150 applies an erase permission voltage (for example, a power source voltage) to the bit lines BLe and BLo at the early stage of the erase operation and applies a program permission voltage (for example, a ground voltage) to bit lines coupled to erased strings ST in a program operation performed according to a result of an erase verify operation during an erase operation.

The column selector 160 selects the page buffers PB of the page buffer group 150 in response to a column address signal CADD generated from the controller 120. Data latched in a page buffer selected by the column selector 160 is outputted. Furthermore, the column selector 160 receives data from the page buffer group 150 through a column line CL and transfers the data to the P/F check circuit 180.

The I/O circuit 170 transfers external input data DATA to the column selector 160 under the control of the controller 120 in a program operation so that the input data DATA is inputted to the page buffers PB of the page buffer group 150. When the column selector 160 sequentially transfers the input data DATA to the page buffers PB of the page buffer group 150, the page buffers PB store the input data DATA in their internal latches. Furthermore, in a read operation, the I/O circuit 170 externally outputs data DATA received from the page buffers PB of the page buffer group 150 via the column selector 160.

The P/F check circuit 180 checks whether an error cell has occurred or not in a verify operation subsequent to a program or erase operation and generates a result of the check in the form of a check signal PFC. Furthermore, the P/F check circuit 180 counts the number of error cells and generates a result of the count in the form of a count signal CS. The controller 120 controls the level of the program voltage Vpgm applied to a selected word line in the program operation of memory cells and also controls the voltage generator 130 so that verify voltages are selectively applied to a selected word line in a program verify operation. In this case, the controller 120 may control the voltage generator 130 in response to the count signal CS of the P/F check circuit 180.

The controller 120 generates the program operation signal PGM, the read operation signal READ, or the erase operation signal ERASE in response to the command signal CMD and generates the page buffer signals PB SIGNALS for controlling the page buffers PB of the page buffer group 150 according to the type of an operation. Furthermore, the controller 120 checks whether the threshold voltages of selected memory cells have risen to a target level or not in response to the count signal CS of the P/F check circuit 180 in a program or erase verify operation and determines whether to perform a program or erase operation again or whether a result of the program or erase operation is a pass or fail according to a result of the check.

Particularly, the controller 120 controls the rise or fall level of the pass voltage Vpass, generated from the voltage generator 130, in response to the critical signal CV in a program operation. That is, in the program operation, when a difference between the program voltage Vpgm and the pass voltage Vpass reaches a critical value, the comparator 200 generates the critical signal CV, and the controller 120 controls the voltage generator 130 so that the voltage generator 130 generates a varied pass voltage Vpass in response to the critical signal CV.

Some exemplary program methods using the above-described semiconductor device are described below.

Figure 4:
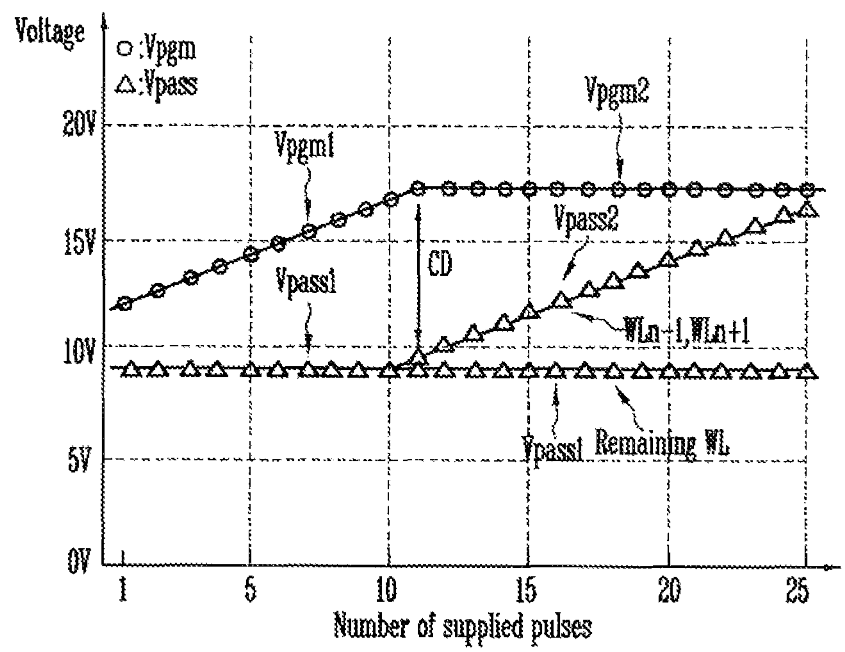
FIG. 4 is a graph illustrating a program method according to an embodiment of the present invention.

FIG. 4 is a graph illustrating a program method according to an embodiment of the present invention.

Referring to FIGS. 4 and 3, a program operation is performed according to an ISPP method of gradually raising a program voltage Vpgm. In the program operation, a program permission voltage (for example, a ground voltage) is applied to selected bit lines coupled to selected cell strings, a program inhibition voltage (for example, a power source voltage) is applied to unselected bit lines coupled to unselected cell strings. In the state in which the program permission voltage or the program inhibition voltage has been applied to the bit lines, a first program voltage Vpgm1 which gradually rises is applied to a selected word line (for example, WLn), and a first pass voltage Vpass1 is applied to the remaining unselected word lines WLn−k to WLn−1 and WLn+1 to WLn+k. In the program operation using an ISPP method, the first program voltage Vpgm1 is raised by a step voltage. At the early stage of the program operation, a difference between the first program voltage Vpgm1 and the first pass voltage Vpass1 is smaller than a Critical voltage Difference (CD). Accordingly, the program voltage Vpgm which gradually rises is applied to the selected word line WLn coupled to selected memory cells Fn, the first pass voltage Vpass1 having a fixed level is applied to the remaining unselected word lines WLn−k to WLn−1 and WLn+1 to WLn+k. The CD refers to a maximum voltage difference at which the first unselected memory cells Fn−1 and Fn+1 adjacent to the selected memory cell Fn are not programmed under the influence of the first program voltage Vpgm1 when the selected memory cell Fn is programmed. The CD may vary according to a semiconductor device and may be calculated by testing the semiconductor device. In an embodiment of the present invention, it is assumed that the CD is 7.5 V.

If the first program voltage Vpgm1 applied to the selected word line WLn is 12 V and the first pass voltage Vpass1 is 9 V, a difference between the first program voltage Vpgm1 and the first pass voltage Vpass1 is 3 V and is lower than the CD. In this case, the first unselected memory cells Fn−1 and Fn+1 adjacent to the selected memory cell Fn are not influenced by the first program voltage Vpgm1, and thus the first pass voltage Vpass1 is applied to all the unselected word lines WLn−k to WLn−1 and WLn+1 to WLn+k. That is, when the threshold voltages of the selected memory cells Fn do not reach a target voltage and until a difference between the first program voltage Vpgm1 and the first pass voltage Vpass1 reaches the CD, the first program voltage Vpgm1 is gradually raised by the step voltage in proportion to the number of first program voltages Vpgm1, and the first pass voltage Vpass1 is fixed to a constant level.

When a difference between the first program voltage Vpgm1 and the first pass voltage Vpass1 reaches the CD while performing the program operation by applying the first program voltage Vpgm1, which gradually rises, to the selected word line WLn, a second program voltage Vpgm2 having a constant level instead of the first program voltage Vpgm1 is applied to the selected word line WLn. That is, when a difference between the first program voltage Vpgm1 and the first pass voltage Vpass1 reaches the CD, the first program voltage Vpgm1 is no longer raised, and the second program voltage Vpgm2 having a constant level is applied. Accordingly, the second program voltage Vpgm2 does not have a step voltage.

When the second program voltage Vpgm2 having a constant level is applied to the selected word line WLn, a second pass voltage Vpass2 which gradually rises is applied to the first unselected word lines WLn−1 and WLn+1 adjacent to both ends of the selected word line WLn to fix the CD between the selected word line WLn and the first unselected word lines WLn−1 and WLn+1. That is, although the second program voltage Vpgm2 having a constant level is applied to the selected word line WLn, when the second pass voltage Vpass2 which gradually rises is applied to the first unselected word lines WLn−1 and WLn+1. The step-up voltage of the second pass voltage Vpass2 may be set identically with the step voltage of the first program voltage Vpgm1. For example, if the step voltage of the first program voltage Vpgm1 is 0.5 V, the step-up voltage of the second pass voltage Vpass2 may also be 0.5 V.

The first pass voltage Vpass1 having a fixed level continues to be applied to the remaining unselected word lines WLn−2 to WLn−k and WLn+2 to WLn+k other than the first unselected word lines WLn−1 and WLn+1.

As described above, an excessive increase of a program voltage applied to the selected word line WLn can be prevented by lowering a maximum value of the program voltage, and the occurrence of leakage between the selected memory cell and the unselected memory cells may be minimized by preventing an excessive rise of the voltage. Furthermore, while a program voltage is fixed to a constant level, a pass voltage applied to the first unselected word lines WLn−1 and WLn+1 adjacent to the selected word line WLn is gradually raised. Accordingly, the deterioration of program efficiency of selected memory cells can be minimized.

Figure 5:
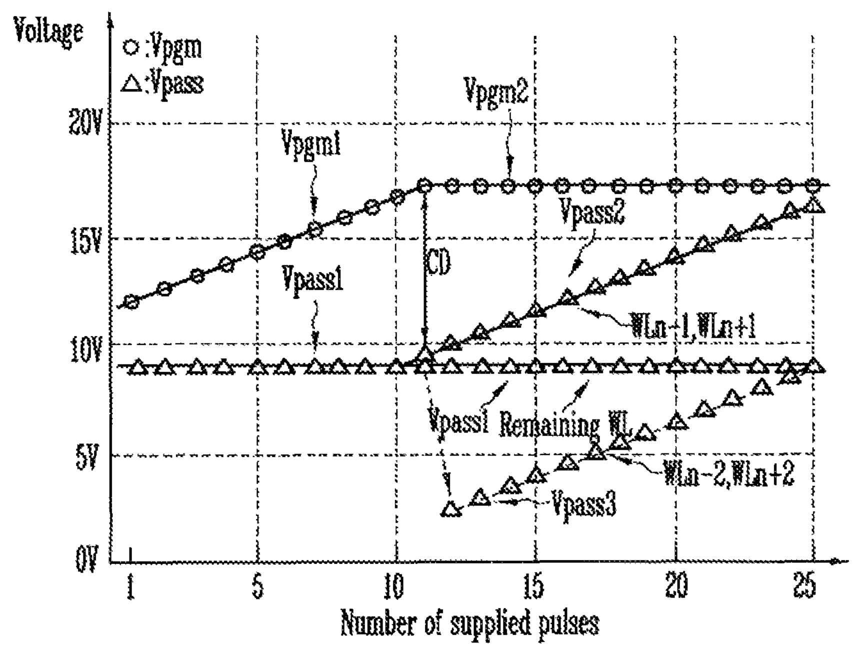
FIG. 5 is a graph illustrating a program method according to an embodiment of the present invention.

FIG. 5 is a graph illustrating a program method according to an embodiment of the present invention.

Referring to FIGS. 5 and 3, a program operation is performed according to an ISPP method of gradually raising a program voltage Vpgm. In the program operation, a program permission voltage (for example, a ground voltage) is applied to selected bit lines coupled to selected cell strings, a program inhibition voltage (for example, a power source voltage) is applied to unselected bit lines coupled to unselected cell strings. In the state in which the program permission voltage or the program inhibition voltage has been applied to the bit lines, a first program voltage Vpgm1 which gradually rises is applied to a selected word line (for example, WLn), and a first pass voltage Vpass1 is applied to the remaining unselected word lines WLn−k to WLn−1 and WLn+1 to WLn+k. In the program operation using an ISPP method, the first program voltage Vpgm1 is raised by a step voltage. At the early stage of the program operation, a difference between the first program voltage Vpgm1 and the first pass voltage Vpass1 is smaller than a Critical voltage Difference (CD). Accordingly, the program voltage Vpgm which gradually rises is applied to the selected word line WLn coupled to selected memory cells Fn, the first pass voltage Vpass1 having a fixed level is applied to the remaining unselected word lines WLn−k to WLn−1 and WLn+1 to WLn+k. The CD refers to a maximum voltage difference at which the first unselected memory cells Fn−1 and Fn+1 adjacent to the selected memory cell Fn are not erased under the influence of the first program voltage Vpgm1 when the selected memory cell Fn is programmed. The CD may vary according to a semiconductor device and may be calculated by testing the semiconductor device. In an embodiment of the present invention, it is assumed that the CD is 7.5 V.

If the first program voltage Vpgm1 applied to the selected word line WLn is 12 V and the first pass voltage Vpass1 is 9 V, a difference between the first program voltage Vpgm1 and the first pass voltage Vpass1 is 3 V and is lower than the CD. In this case, the first unselected memory cells Fn−1 and Fn+1 adjacent to the selected memory cell Fn are not influenced by the first program voltage Vpgm1, and thus the first pass voltage Vpass1 is applied to all the unselected word lines WLn−k to WLn−1 and WLn+1 to WLn+k. That is, when the threshold voltages of the selected memory cells Fn do not reach a target voltage and until a difference between the first program voltage Vpgm1 and the first pass voltage Vpass1 reaches the CD, the first program voltage Vpgm1 is gradually raised by the step voltage in proportion to the number of first program voltages Vpgm1, and the first pass voltage Vpass1 is fixed to a constant level.

When a difference between the first program voltage Vpgm1 and the first pass voltage Vpass1 reaches the CD while performing the program operation by applying the selected word line WLn with the first program voltage Vpgm1 which gradually rises, a second program voltage Vpgm2 having a constant level instead of the first program voltage Vpgm1 is applied to the selected word line WLn. That is, when a difference between the first program voltage Vpgm1 and the first pass voltage Vpass1 reaches the CD, the first program voltage Vpgm1 is no longer raised, and the second program voltage Vpgm2 having a constant level is applied. Accordingly, the second program voltage Vpgm2 does not have a step voltage.

When the second program voltage Vpgm2 having a constant level is applied to the selected word line WLn, a second pass voltage Vpass2 which gradually rises is applied to the first unselected word lines WLn−1 and WLn+1 adjacent to both ends of the selected word line WLn. That is, although the second program voltage Vpgm2 having a constant level is applied to the selected word line WLn, when the second pass voltage Vpass2 which gradually rises is applied to the first unselected word lines WLn−1 and WLn+1, the deterioration of the efficiency of the program operation due to the second program voltage Vpgm2 having a constant level can be prevented, and a decrease of the threshold voltages of the memory cells coupling to the first unselected word lines WLn−1 and WLn+1 may be prevented. The step-up voltage of the second pass voltage Vpass2 may be set identically with the step voltage of the first program voltage Vpgm1. For example, if the step voltage of the first program voltage Vpgm1 is 0.5 V, the step-up voltage of the second pass voltage Vpass2 may also be 0.5 V.

In particular, while the second pass voltage Vpass2 which gradually rises is applied to the first unselected word lines WLn−1 and WLn+1, the threshold voltages of first unselected memory cells Fn−1 and Fn+1 coupled to the first unselected word lines WLn−1 and WLn+1, respectively, and the threshold voltages of second unselected memory cells Fn−2 and Fn+2 adjacent to the first unselected memory cells Fn−1 and Fn+1 may decrease. In order to prevent the decrease, a third pass voltage Vpass3 lower than the first pass voltage Vpass1 by the CD is applied to the second unselected word lines WLn−2 and WLn+2 adjacent to the first unselected word lines WLn−1 and WLn+1. The first pass voltage Vpass1 continues to be applied to the remaining unselected word lines WLn−3 to WLn−k and WLn+3 to WLn+k other than the first unselected word lines WLn−1 and WLn+1 and the second unselected word lines WLn−2 and WLn+2. That is, in order to prevent a decrease in the threshold voltages of the first and the second unselected memory cells Fn−1 and Fn+1 and Fn−2 and Fn+2 under the influence of the second pass voltage Vpass2 which gradually rises, the level of the first pass voltage Vpass1 applied to the second unselected word lines WLn−2 and WLn+2 coupled to the second unselected memory cells Fn−2 and Fn+2 is lowered by the CD, and the third pass voltage Vpass3 which gradually rises is applied. For example, if the step voltage of the first program voltage Vpgm1 is 0.5 V, each of the second pass voltage Vpass2 and the third pass voltage Vpass3 may also be gradually raised by 0.5 V.

As described above, an excessive increase of a program voltage applied to the selected word line WLn can be prevented by lowering a maximum value of the program voltage, and the occurrence of leakage of the unselected memory cells can be prevented by preventing an excessive rise of the voltage. Furthermore, while a program operation is performed using a program voltage having a constant level, a pass voltage applied to the first unselected word lines WLn−1 and WLn+1 adjacent to the selected word line WLn is gradually raised. Accordingly, the deterioration of program efficiency of selected memory cells can be prevented. When the third pass voltage Vpass3 lower than the second pass voltage Vapss2 by the CD is applied to the second unselected word lines WLn−2 and WLn+2, a decrease in the threshold voltages of the first and the second unselected memory cells Fn−1 and Fn+1 and Fn−2 and Fn+2 can be prevented.

Figure 6:
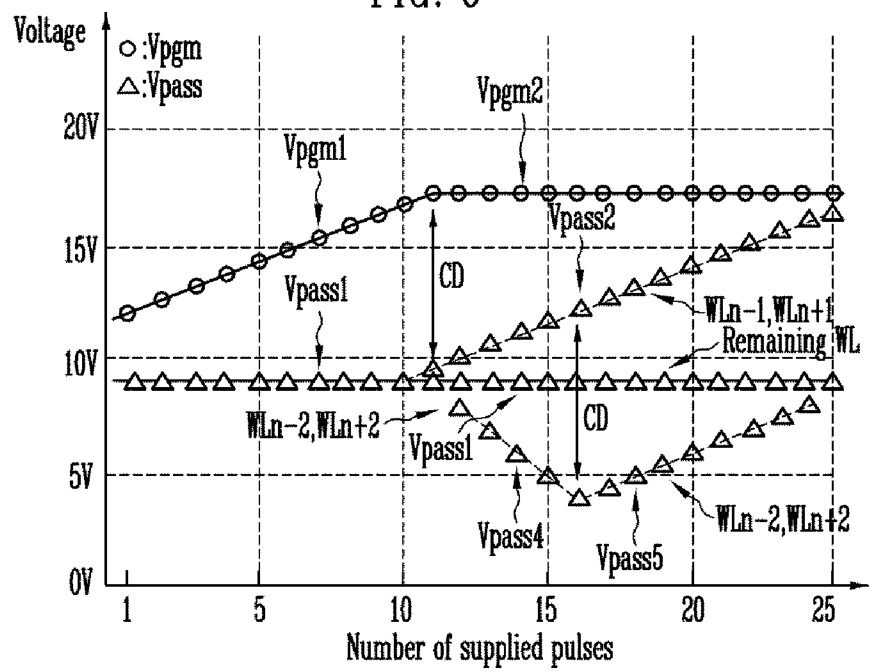
FIG. 6 is a graph illustrating a program method according to an embodiment of the present invention.

FIG. 6 is a graph illustrating a program method according to an embodiment of the present invention.

Referring to FIGS. 6 and 3, a program operation is performed according to an ISPP method of gradually raising a program voltage Vpgm. In the program operation, a program permission voltage (for example, a ground voltage) is applied to selected bit lines coupled to selected cell strings, a program inhibition voltage (for example, a power source voltage) is applied to unselected bit lines coupled to unselected cell strings. In the state in which the program permission voltage or the program inhibition voltage has been applied to the bit lines, a first program voltage Vpgm1 which gradually rises is applied to a selected word line (for example, WLn), and a first pass voltage Vpass1 is applied to the remaining unselected word lines WLn−k to WLn−1 and WLn+1 to WLn+k. In the program operation using an ISPP method, the first program voltage Vpgm1 is raised by a step voltage. At the early stage of the program operation, a difference between the first program voltage Vpgm1 and the first pass voltage Vpass1 is smaller than a Critical voltage Difference (CD). Accordingly, the program voltage Vpgm which gradually rises is applied to the selected word line WLn coupled to selected memory cells Fn, the first pass voltage Vpass1 having a fixed level is applied to the remaining unselected word lines WLn−k to WLn−1 and WLn+1 to WLn+k. The CD refers to a maximum voltage difference at which the first unselected memory cells Fn−1 and Fn+1 adjacent to the selected memory cell Fn are not erased under the influence of the first program voltage Vpgm1 when the selected memory cell Fn is programmed. The CD may vary according to a semiconductor device and may be calculated by testing the semiconductor device. In an embodiment of the present invention, it is assumed that the CD is 7.5 V.

If the first program voltage Vpgm1 applied to the selected word line WLn is 12 V and the first pass voltage Vpass1 is 9 V, a difference between the first program voltage Vpgm1 and the first pass voltage Vpass1 is 3 V and is lower than the CD. In this case, the first unselected memory cells Fn−1 and Fn+1 adjacent to the selected memory cell Fn are not influenced by the first program voltage Vpgm1, and thus the first pass voltage Vpass1 is applied to all the unselected word lines WLn−k to WLn−1 and WLn+1 to WLn+k. That is, when the threshold voltages of the selected memory cells Fn do not reach a target voltage and until a difference between the first program voltage Vpgm1 and the first pass voltage Vpass1 reaches the CD, the first program voltage Vpgm1 is gradually raised by the step voltage in proportion to the number of first program voltages Vpgm1, and the first pass voltage Vpass1 is fixed to a constant level.

When a difference between the first program voltage Vpgm1 and the first pass voltage Vpass1 reaches the CD while performing the program operation by applying the selected word line WLn with the first program voltage Vpgm1 which gradually rises, a second program voltage Vpgm2 having a constant level instead of the first program voltage Vpgm1 is applied to the selected word line WLn. That is, when a difference between the first program voltage Vpgm1 and the first pass voltage Vpass1 reaches the CD, the first program voltage Vpgm1 is no longer raised, and the second program voltage Vpgm2 having a constant level is applied. Accordingly, the second program voltage Vpgm2 does not have a step voltage.

When the second program voltage Vpgm2 having a constant level is applied to the selected word line WLn, the program efficiency of the selected memory cells coupled to the selected word line WLn may deteriorate. In order to compensate for the deteriorated program efficiency, a second pass voltage Vpass2 which gradually rises is applied to the first unselected word lines WLn−1 and WLn+1 adjacent to both ends of the selected word line WLn. That is, although the second program voltage Vpgm2 having a constant level is applied to the selected word line WLn, when the second pass voltage Vpass2 which gradually rises is applied to the first unselected word lines WLn−1 and WLn+1, the deterioration of the efficiency of the program operation due to the second program voltage Vpgm2 having a constant level can be prevented under the influence of the second pass voltage Vpass2. The step-up voltage of the second pass voltage Vpass2 may be set identically with the step voltage of the first program voltage Vpgm1. For example, if the step voltage of the first program voltage Vpgm1 is 0.5 V, the step-up voltage of the second pass voltage Vpass2 may also be 0.5 V.

When the second pass voltage Vpass2 which gradually rises is applied to the first unselected word lines WLn−1 and WLn+1, a fourth pass voltage Vpass4 which gradually drops is applied to the second unselected word lines WLn−2 and WLn+2 adjacent to the first unselected word lines WLn−1 and WLn+1. The first pass voltage Vpass1 having the constant level continues to be applied to the remaining unselected word lines WLn−k to WLn−3 and WLn+3 to WLn+k other than the first unselected word lines WLn−1 and WLn+1 adjacent to the selected word line WLn and the second unselected word lines WLn−2 and WLn+2 adjacent to the first unselected word lines WLn−1 and WLn+1.

The fourth pass voltage Vpass4 is applied to the second unselected memory cells Fn−2 and Fn+2 adjacent to the first unselected memory cells Fn−1 and Fn+1, respectively. That is, in order to prevent a decrease in the threshold voltages of the first and the second unselected memory cells Fn−1, Fn+1, Fn−2 and Fn+2 due to the second pass voltage Vpass2 which gradually rises, the fourth pass voltage Vpass4 gradually dropping by a step-down voltage is applied to the second unselected word lines WLn−2 and WLn+2 coupled to the second unselected memory cells Fn−2 and Fn+2. The fourth pass voltage Vpass4 is described in detail below. If a coupling ratio due to a word line coupled to a selected memory cell is 0.6 and a coupling ratio due to a word line coupled to a memory cell adjacent to the selected memory cell is 0.15, a maximum step-down voltage of the fourth pass voltage Vpass4 is 0.5 V×(0.6/0.15)=2 V. Accordingly, the step-down voltage of the fourth pass voltage Vpass4 may be set within a range which is higher than the ground voltage 0 V, but lower than 2 V.

The second pass voltage Vpass2 gradually rises by the step-up voltage, and the fourth pass voltage Vpass4 gradually drops by the step-down voltage. Thus, before the program operation is completed, a difference between the second pass voltage Vpass2 and the fourth pass voltage Vpass4 may reach the CD. When a difference between the second pass voltage Vpass2 and the fourth pass voltage Vpass4 reaches the CD, a fifth pass voltage Vpass5 which gradually rises is applied to the second unselected word lines WLn−2 and WLn+2 to which the fourth pass voltage Vpass4 has been applied. That is, when a difference between the second pass voltage Vpass2 and the fourth pass voltage Vpass4 becomes the CD or higher, the threshold voltages of the memory cells Fn−1 and Fn+1 may decrease owing to the second pass voltage Vpass2 which gradually rises. In order to prevent the decease, the fifth pass voltage Vpass5 gradually rising by a step-up voltage is applied to the second unselected word lines WLn−2 and WLn+2. While the second or fifth pass voltage Vpass2 or Vpass5 is applied to the first and the second the unselected word lines WLn−1 and WLn+1 and WLn−2 and WLn+2, the first pass voltage Vpass1 having the constant level continues to be applied to the remaining unselected word lines WLn−k to WLn−3 and WLn+3 to WLn+k.

As described above, an excessive increase of a program voltage applied to the selected word line WLn can be prevented by lowering a maximum value of the program voltage, and the occurrence of leakage of the unselected memory cells can be prevented. Furthermore, while a program operation is performed using a program voltage having a constant level, a pass voltage applied to the first unselected word lines WLn−1 and WLn+1 adjacent to the selected word line WLn is gradually raised. Accordingly, the deterioration of program efficiency of selected. Furthermore, by controlling the pass voltages applied to the second and the third unselected word lines WLn−2, WLn+2, WLn−3 and WLn+3, a shift in the threshold voltages of the first to third unselected memory cells Fn−3 to Fn−1 and Fn+1 to Fn+3 due to the second pass voltage Vpass2 applied to the first unselected word lines WLn−1 and WLn+1 can be prevented.

Figure 7:
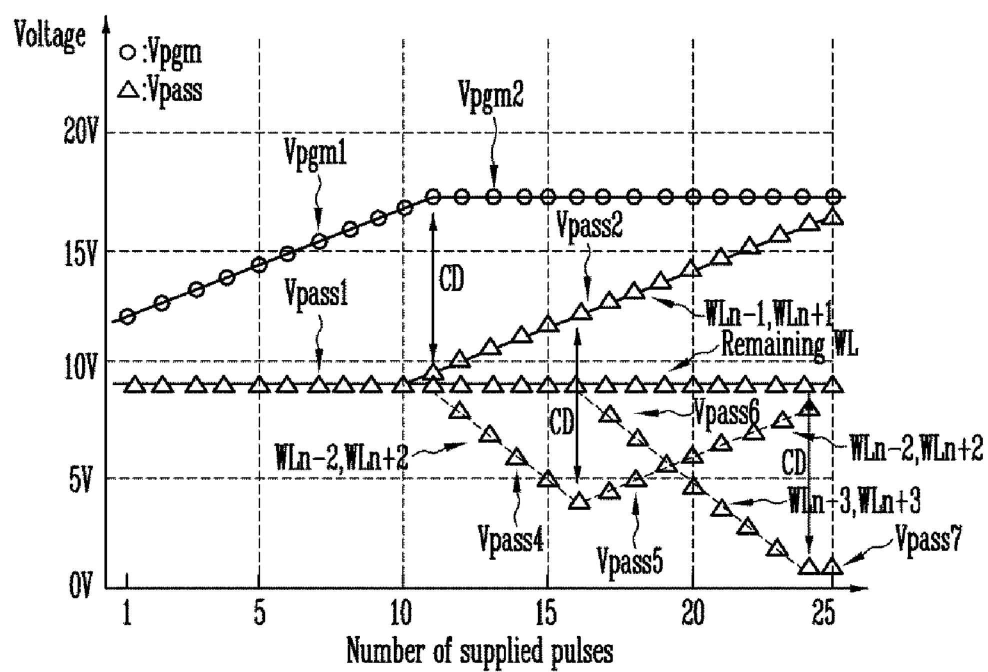
FIG. 7 is a graph illustrating a program method according to an embodiment of the present invention.

FIG. 7 is a graph illustrating a program method according to an embodiment of the present invention.

Referring to FIGS. 7 and 3, a program operation is performed according to an ISPP method of gradually raising a program voltage Vpgm. In the program operation, a program permission voltage (for example, a ground voltage) is applied to selected bit lines coupled to selected cell strings, a program inhibition voltage (for example, a power source voltage) is applied to unselected bit lines coupled to unselected cell strings. In the state in which the program permission voltage or the program inhibition voltage has been applied to the bit lines, a first program voltage Vpgm1 which gradually rises is applied to a selected word line (for example, WLn), and a first pass voltage Vpass1 is applied to the remaining unselected word lines WLn−k to WLn−1 and WLn+1 to WLn+k. In the program operation using an ISPP method, the first program voltage Vpgm1 is raised by a step voltage. At the early stage of the program operation, a difference between the first program voltage Vpgm1 and the first pass voltage Vpass1 is smaller than a Critical voltage Difference (CD). Accordingly, the program voltage Vpgm which gradually rises is applied to the selected word line WLn coupled to selected memory cells Fn, the first pass voltage Vpass1 having a fixed level is applied to the remaining unselected word lines WLn−k to WLn−1 and WLn+1 to WLn+k. The CD refers to a maximum voltage difference at which the first unselected memory cells Fn−1 and Fn+1 adjacent to the selected memory cell Fn are not erased under the influence of the first program voltage Vpgm1 when the selected memory cell Fn is programmed. The CD may vary according to a semiconductor device and may be calculated by testing the semiconductor device. In an embodiment of the present invention, it is assumed that the CD is 7.5 V.

If the first program voltage Vpgm1 applied to the selected word line WLn is 12 V and the first pass voltage Vpass1 is 9 V, a difference between the first program voltage Vpgm1 and the first pass voltage Vpass1 is 3 V and is lower than the CD. In this case, the first unselected memory cells Fn−1 and Fn+1 adjacent to the selected memory cell Fn are not influenced by the first program voltage Vpgm1, and thus the first pass voltage Vpass1 is applied to all the unselected word lines WLn−k to WLn−1 and WLn+1 to WLn+k. That is, when the threshold voltages of the selected memory cells Fn do not reach a target voltage and until a difference between the first program voltage Vpgm1 and the first pass voltage Vpass1 reaches the CD, the first program voltage Vpgm1 is gradually raised by the step voltage in proportion to the number of first program voltages Vpgm1, and the first pass voltage Vpass1 is fixed to a constant level.

When a difference between the first program voltage Vpgm1 and the first pass voltage Vpass1 reaches the CD while performing the program operation by applying the selected word line WLn with the first program voltage Vpgm1 which gradually rises, a second program voltage Vpgm2 having a constant level instead of the first program voltage Vpgm1 is applied to the selected word line WLn. That is, when a difference between the first program voltage Vpgm1 and the first pass voltage Vpass1 reaches the CD, the first program voltage Vpgm1 is no longer raised, and the second program voltage Vpgm2 having a constant level is applied. Accordingly, the second program voltage Vpgm2 does not have a step voltage.

When the second program voltage Vpgm2 having a constant level is applied to the selected word line WLn, a second pass voltage Vpass2 which gradually rises is applied to the first unselected word lines WLn−1 and WLn+1 adjacent to both ends of the selected word line WLn. That is, although the second program voltage Vpgm2 having a constant level is applied to the selected word line WLn, when the second pass voltage Vpass2 which gradually rises is applied to the first unselected word lines WLn−1 and WLn+1, the potentials of the selected memory cells rise under the influence of the second pass voltage Vpass2. Accordingly, the deterioration of the efficiency of the program operation due to the second program voltage Vpgm2 having a constant level can be prevented. The step-up voltage of the second pass voltage Vpass2 may be set identically with the step voltage of the first program voltage Vpgm1. For example, if the step voltage of the first program voltage Vpgm1 is 0.5 V, the step-up voltage of the second pass voltage Vpass2 may also be 0.5 V.

When the second pass voltage Vpass2 which gradually rises is applied to the first unselected word lines WLn−1 and WLn+1, a fourth pass voltage Vpass4 which gradually drops is applied to the second unselected word lines WLn−2 and WLn+2 adjacent to the first unselected word lines WLn−1 and WLn+1. The first pass voltage Vpass1 having the constant level continues to be applied to the remaining unselected word lines WLn−3 to WLn−k and WLn+3 to WLn+k other than the first unselected word lines WLn−1 and WLn+1 adjacent to the selected word line WLn and the second unselected word lines WLn−2 and WLn+2 adjacent to the first unselected word lines WLn−1 and WLn+1.

The fourth pass voltage Vpass4 is applied to the second unselected memory cells Fn−2 and Fn+2 adjacent to the first unselected memory cells Fn−1 and Fn+1, respectively. That is, in order to prevent a decrease in the threshold voltages of the first and the second unselected memory cells Fn−1 and Fn+1 and Fn−2 and Fn+2 due to the second pass voltage Vpass2 which gradually rises, the fourth pass voltage Vpass4 gradually dropping by a step-down voltage is applied to the second unselected word lines WLn−2 and WLn+2 coupled to the second unselected memory cells Fn−2 and Fn+2. The fourth pass voltage Vpass4 is described in detail below. If a coupling ratio due to a word line coupled to a selected memory cell is 0.6 and a coupling ratio due to a word line coupled to a memory cell adjacent to the selected memory cell is 0.15, a maximum step-down voltage of the fourth pass voltage Vpass4 is 0.5 V×(0.6/0.15)=2 V. Accordingly, the step-down voltage of the fourth pass voltage Vpass4 may be set within a range which is higher than the ground voltage 0 V, but lower than 2 V.

The second pass voltage Vpass2 gradually rises, and the fourth pass voltage Vpass4 gradually drops. Thus, before the program operation is completed, a difference between the second pass voltage Vpass2 and the fourth pass voltage Vpass4 may reach the CD. From this time, a fifth pass voltage Vpass5 which gradually rises is applied to the second unselected word lines WLn−2 and WLn+2 to which the fourth pass voltage Vpass4 had been applied, and a sixth pass voltage Vpass6 which gradually drops is applied to the third unselected word lines WLn−3 and WLn+3 adjacent to the second unselected word lines WLn−2 and WLn+2. That is, when a difference between the second pass voltage Vpass2 and the fourth pass voltage Vpass4 becomes the CD or higher, the threshold voltages of the first unselected memory cells Fn−1 and Fn+1 may decrease owing to the second pass voltage Vpass2 which gradually rises. In order to prevent the decrease, the fifth pass voltage Vpass5 which gradually rises is applied to the second unselected word lines WLn−2 and WLn+2. When the second, fifth, or sixth pass voltage Vpass2, Vpass5, or Vpass6 is applied to the first to third unselected word lines WLn−3 to WLn−1 and WLn+1 to WLn+3 sequentially adjacent to the selected word line WLn, the first pass voltage Vpass having a fixed level continues to be applied to the remaining unselected word lines WLn−k to WLn−4 and WLn+4 to WLn+k.

While the sixth pass voltage Vpass6 which gradually drops is applied to the third unselected word lines WLn−3 and WLn+3, a difference between the sixth pass voltage Vpass6 and the first pass voltage Vpass1 may reach the CD. From this time, in order to prevent a further increase in the voltage difference between the third unselected word lines WLn−3 and WLn+3 and the fourth word lines WLn−4 and WLn+4, a seventh pass voltage Vpass7 having a constant level is applied to the third unselected word lines WLn−3 and WLn+3 having potentials dropped to the sixth pass voltage Vpass6.

As described above, an excessive increase of a program voltage applied to the selected word line WLn can be prevented by lowering a maximum value of the program voltage, and the occurrence of leakage of the unselected memory cells can be prevented by preventing an excessive rise of the voltage. Furthermore, a shift in the threshold voltages of the first to third memory cells Fn−1 to Fn−3 and Fn+1 to Fn+3 adjacent to the selected memory cell Fn can be prevented in the program operation of the selected memory cell Fn by controlling the pass voltages applied to the first to third unselected word lines WLn−3 to WLn−1 and WLn+1 to WLn+3 adjacent to the selected word line WLn.

Figure 8:
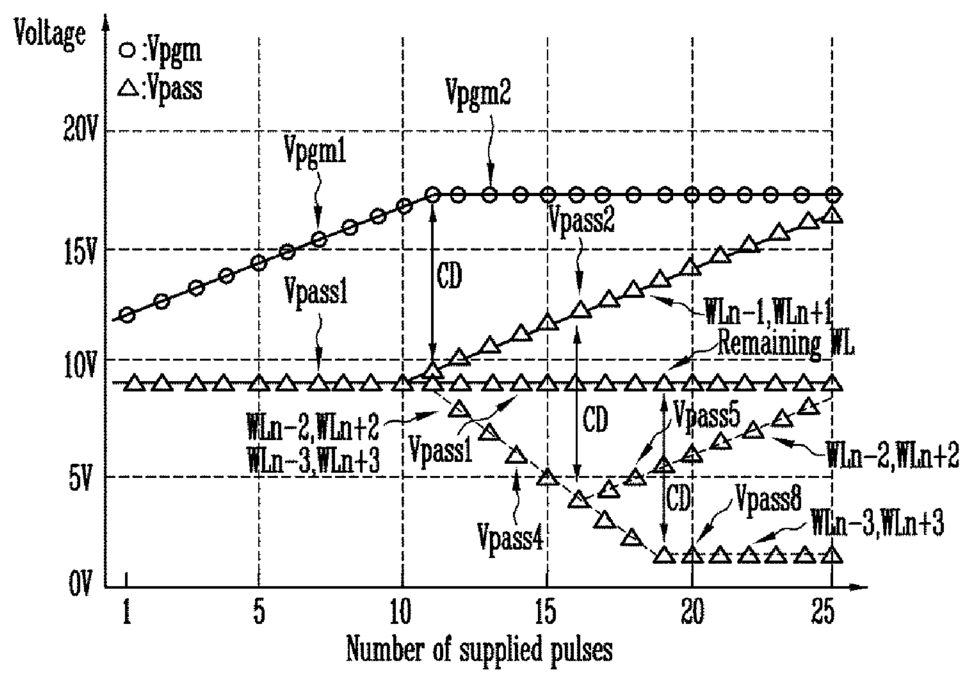
FIG. 8 is a graph illustrating a program method according to an embodiment of the present invention.

FIG. 8 is a graph illustrating a program method according to an embodiment of the present invention.

Referring to FIGS. 8 and 3, a program operation is performed according to an ISPP method of gradually raising a program voltage Vpgm. In the program operation, a program permission voltage (for example, a ground voltage) is applied to selected bit lines coupled to selected cell strings, a program inhibition voltage (for example, a power source voltage) is applied to unselected bit lines coupled to unselected cell strings. In the state in which the program permission voltage or the program inhibition voltage has been applied to the bit lines, a first program voltage Vpgm1 which gradually rises is applied to a selected word line (for example, WLn), and a first pass voltage Vpass1 is applied to the remaining unselected word lines WLn−k to WLn−1 and WLn+1 to WLn+k. In the program operation using an ISPP method, the first program voltage Vpgm1 is raised by a step voltage. At the early stage of the program operation, a difference between the first program voltage Vpgm1 and the first pass voltage Vpass1 is smaller than a Critical voltage Difference (CD). Accordingly, the program voltage Vpgm which gradually rises is applied to the selected word line WLn coupled to selected memory cells Fn, the first pass voltage Vpass1 having a fixed level is applied to the remaining unselected word lines WLn−k to WLn−1 and WLn+1 to WLn+k. The CD refers to a maximum voltage difference at which the first unselected memory cells Fn−1 and Fn+1 adjacent to the selected memory cell Fn are not erased under the influence of the first program voltage Vpgm1 when the selected memory cell Fn is programmed. The CD may vary according to a semiconductor device and may be calculated by testing the semiconductor device. In an embodiment of the present invention, it is assumed that the CD is 7.5 V.

If the first program voltage Vpgm1 applied to the selected word line WLn is 12 V and the first pass voltage Vpass1 is 9 V, a difference between the first program voltage Vpgm1 and the first pass voltage Vpass1 is 3 V and is lower than the CD. In this case, the first unselected memory cells Fn−1 and Fn+1 adjacent to the selected memory cell Fn are not influenced by the first program voltage Vpgm1, and thus the first pass voltage Vpass1 is applied to all the unselected word lines WLn−k to WLn−1 and WLn+1 to WLn+k. That is, when the threshold voltages of the selected memory cells Fn do not reach a target voltage and until a difference between the first program voltage Vpgm1 and the first pass voltage Vpass1 reaches the CD, the first program voltage Vpgm1 is gradually raised by the step voltage in proportion to the number of first program voltages Vpgm1, and the first pass voltage Vpass1 is fixed to a constant level.

When a difference between the first program voltage Vpgm1 and the first pass voltage Vpass1 reaches the CD while performing the program operation by applying the selected word line WLn with the first program voltage Vpgm1 which gradually rises, a second program voltage Vpgm2 having a constant level instead of the first program voltage Vpgm1 is applied to the selected word line WLn. That is, when a difference between the first program voltage Vpgm1 and the first pass voltage Vpass1 reaches the CD, the first program voltage Vpgm1 is no longer raised, and the second program voltage Vpgm2 having a constant level is applied. Accordingly, the second program voltage Vpgm2 does not have a step voltage.

When the second program voltage Vpgm2 having a constant level is applied to the selected word line WLn, a second pass voltage Vpass2 which gradually rises is applied to the first unselected word lines WLn−1 and WLn+1 adjacent to both ends of the selected word line WLn. That is, although the second program voltage Vpgm2 having a constant level is applied to the selected word line WLn, when the second pass voltage Vpass2 which gradually rises is applied to the first unselected word lines WLn−1 and WLn+1, the potentials of the selected memory cells rise under the influence of the second pass voltage Vpass2. Accordingly, the deterioration of the efficiency of the program operation due to the second program voltage Vpgm2 having a constant level can be prevented. The step-up voltage of the second pass voltage Vpass2 may be set identically with the step voltage of the first program voltage Vpgm1. For example, if the step voltage of the first program voltage Vpgm1 is 0.5 V, the step-up voltage of the second pass voltage Vpass2 may also be 0.5 V.

When the second pass voltage Vpass2 which gradually rises is applied to the first unselected word lines WLn−1 and WLn+1, a fourth pass voltage Vpass4 which gradually drops is applied to the second and the third unselected word lines WLn−2 and WLn+2 and WLn−3 and WLn+3 adjacent to the first unselected word lines WLn−1 and WLn+1. The first pass voltage Vpass1 having the constant level continues to be applied to the remaining unselected word lines WLn−k to WLn−4 and WLn+4 to WLn+k other than the first unselected word lines WLn−1 and WLn+1 adjacent to the selected word line WLn and the second and the third unselected word lines WLn−2, WLn+2, WLn−3 and WLn+3 adjacent to the first unselected word lines WLn−1 and WLn+1.

The fourth pass voltage Vpass4 gradually dropping by a step-down voltage is applied to the second and the third unselected word lines WLn−2 and WLn+2 and WLn−3 and WLn+3 in order to prevent a decrease in the threshold voltages of the first and the second unselected memory cells Fn−1 and Fn+1 and Fn−2 and Fn+2 owing to the second pass voltage Vpass2 which gradually rises. The fourth pass voltage Vpass4 is described in detail below. If a coupling ratio due to a word line coupled to a selected memory cell is 0.6 and a coupling ratio due to a word line coupled to a memory cell adjacent to the selected memory cell is 0.15, a maximum step-down voltage of the fourth pass voltage Vpass4 is 0.5 V×(0.6/0.15)=2 V. Accordingly, the step-down voltage of the fourth pass voltage Vpass4 may be set within a range which is higher than the ground voltage 0 V, but lower than 2 V.

The second pass voltage Vpass2 gradually rises, and the fourth pass voltage Vpass4 gradually drops. Thus, before the program operation is completed, a difference between the second pass voltage Vpass2 and the fourth pass voltage Vpass4 may reach the CD. From this time, a fifth pass voltage Vpass5 which gradually rises is applied to the second unselected word lines WLn−2, and the fourth pass voltage Vpass4 which gradually drops continues to be applied to the third unselected word lines WLn−3 and WLn+3. That is, the second unselected memory cells Fn−2 and Fn+2 are more influenced by the second pass voltage Vpass2, applied to the first unselected word lines WLn−1 and WLn+1, than the third unselected memory cells Fn−3 and Fn+3. Thus, the potentials of the second unselected word lines WLn−2 and WLn+2 coupled to the second unselected memory cells Fn−2 and Fn+2 are raised in order to reduce the influence of the second pass voltage Vpass1. The first pass voltage Vpass1 having the fixed level continues to be applied to the remaining unselected word lines WLn−k to WLn−4 and WLn+4 to WLn+k When a difference between the first pass voltage Vpass1 and the fourth pass voltage Vpass4 applied to the third unselected word lines WLn−3 and WLn+3 reaches the CD because the fourth pass voltage Vpass4 has dropped, an eighth pass voltage Vpass8 having a constant level is applied to the third unselected word lines WLn−3 and WLn+3.

As described above, an excessive increase of a program voltage applied to the selected word line WLn can be prevented by lowering a maximum value of the program voltage, and the occurrence of leakage of the unselected memory cells can be prevented by preventing an excessive rise of the voltage. Furthermore, a shift in the threshold voltages of the first to third memory cells Fn−3 to Fn−1 and Fn+1 to Fn+3 adjacent to the selected memory cell Fn can be prevented in the program operation of the selected memory cell Fn by controlling the pass voltages applied to the first to third unselected word lines WLn−3 to WLn−1 and WLn+1 to WLn+3 adjacent to the selected word line WLn.

Figure 9:
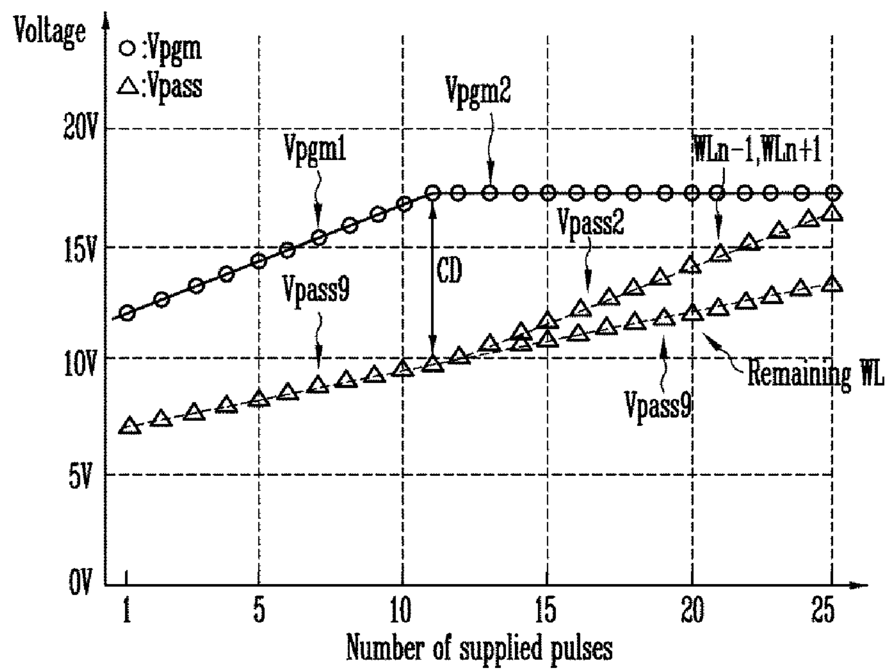
FIG. 9 is a graph illustrating a program method according to an embodiment of the present invention.

FIG. 9 is a graph illustrating a program method according to an embodiment of the present invention.

Referring to FIGS. 9 and 3, a program operation is performed according to an ISPP method of gradually raising a program voltage Vpgm. In the program operation, a program permission voltage (for example, a ground voltage) is applied to selected bit lines coupled to selected cell strings, a program inhibition voltage (for example, a power source voltage) is applied to unselected bit lines coupled to unselected cell strings. In the state in which the program permission voltage or the program inhibition voltage has been applied to the bit lines, a first program voltage Vpgm1 which gradually rises is applied to a selected word line (for example, WLn), and a ninth pass voltage Vpass9 which gradually rises is applied to the remaining unselected word lines WLn−k to WLn−1 and WLn+1 to WLn+k. Here, an increment of the ninth pass voltage Vpass9 is smaller than an increment of the first program voltage Vpgm1. The reason why the ninth pass voltage Vpass9 which gradually rises is applied to the remaining unselected word lines WLn−k to WLn−1 and WLn+1 to WLn+k as described above is to prevent unselected memory cells, included in the unselected cell strings, from being erased owing to the first program voltage Vpgm1 which gradually rises. That is, since the program inhibition voltage Vcc is applied to the bit lines coupled to the unselected cell strings, channel boosting is generated owing to the program inhibition voltage and the voltage applied to the word lines WLn−k to WLn+k. When a gradually rising voltage, such as the ninth pass voltage Vpass9, is applied, the potential of a channel can be raised because channel boosting is generated more efficiently.

At the early stage of the program operation, a difference between the first program voltage Vpgm1 and the ninth pass voltage Vpass9 is smaller than a Critical voltage Difference (CD). Accordingly, the first program voltage Vpgm1 which gradually rises is applied to the selected word line WLn coupled to the selected memory cells Fn, the ninth pass voltage Vpass9 is applied to the remaining unselected word lines WLn−k to WLn−1 and WLn+1 to WLn+k. The CD refers to a maximum voltage difference at which the first unselected memory cells Fn−1 and Fn+1 adjacent to the selected memory cell Fn are not erased under the influence of the first program voltage Vpgm1 when the selected memory cell Fn is programmed. The CD may vary according to a semiconductor device and may be calculated by testing the semiconductor device. In an embodiment of the present invention, it is assumed that the CD is 7.5 V.

If the first program voltage Vpgm1 applied to the selected word line WLn is 12 V and the ninth pass voltage Vpass9 is 7 V, a difference between the first program voltage Vpgm1 and the ninth pass voltage Vpass9 is 5 V and is lower than the CD. In this case, the first unselected memory cells Fn−1 and Fn+1 adjacent to the selected memory cell Fn are not influenced by the first program voltage Vpgm1, and thus the ninth pass voltage Vpass9 is applied to all the unselected word lines WLn−k to WLn−1 and WLn+1 to WLn+k. That is, when the threshold voltages of the selected memory cells Fn do not reach a target voltage and until a difference between the first program voltage Vpgm1 and the ninth pass voltage Vpass9 reaches the CD, the first program voltage Vpgm1 and the ninth pass voltage Vpass9 are gradually raised in proportion to the number of first program voltages Vpgm1.

When a difference between the first program voltage Vpgm1 and the ninth pass voltage Vpass9 reaches the CD while performing the program operation by applying the selected word line WLn with the first program voltage Vpgm1 which gradually rises, a second program voltage Vpgm2 having a constant level instead of the first program voltage Vpgm1 is applied to the selected word line WLn. That is, when a difference between the first program voltage Vpgm1 and the ninth pass voltage Vpass9 reaches the CD, the first program voltage Vpgm1 is no longer raised, and the second program voltage Vpgm2 having a constant level is applied. Accordingly, the second program voltage Vpgm2 does not have a step voltage.

When the second program voltage Vpgm2 having a constant level is applied to the selected word line WLn, the program efficiency of the selected memory cells coupled to the selected word line WLn may deteriorate. In order to compensate for the deteriorated program efficiency, a second pass voltage Vpass2 which gradually rises is applied to the first unselected word lines WLn−1 and WLn+1 adjacent to both ends of the selected word line WLn. That is, although the second program voltage Vpgm2 having a constant level is applied to the selected word line WLn, when the second pass voltage Vpass2 which gradually rises is applied to the first unselected word lines WLn−1 and WLn+1, the potentials of the selected memory cells rise under the influence of the second pass voltage Vpass2. Accordingly, the deterioration of the efficiency of the program operation due to the second program voltage Vpgm2 having a constant level can be prevented. The step-up voltage of the second pass voltage Vpass2 may be set identically with the step voltage of the first program voltage Vpgm1. For example, if the step voltage of the first program voltage Vpgm1 is 0.5 V, the step-up voltage of the second pass voltage Vpass2 may also be 0.5 V.

The ninth pass voltage Vpass9 continues to be applied to the remaining unselected word lines WLn−k to WLn−2 and WLn+2 to WLn+k other than the first unselected word lines WLn−1 and WLn+1.

As described above, an excessive increase of a program voltage applied to the selected word line WLn can be prevented by lowering a maximum value of the program voltage, and the occurrence of leakage of the unselectes memory cells can be prevented by preventing an excessive rise of the voltage. Furthermore, while a program voltage is fixed to a constant level, a pass voltage applied to the first unselected word lines WLn−1 and WLn+1 adjacent to the selected word line WLn is gradually raised. Accordingly, the deterioration of program efficiency of selected memory cells can be prevented.

Figure 10:
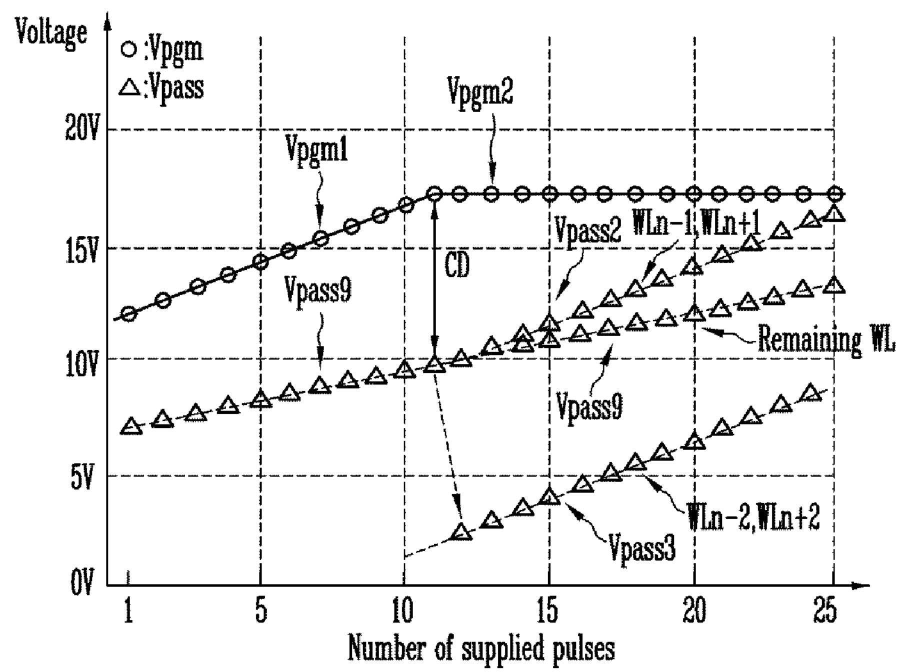
FIG. 10 is a graph illustrating a program method according to an embodiment of the present invention.

FIG. 10 is a graph illustrating a program method according to an embodiment of the present invention.

Referring to FIGS. 10 and 3, a program operation is performed according to an ISPP method of gradually raising a program voltage Vpgm. In the program operation, a program permission voltage (for example, a ground voltage) is applied to selected bit lines coupled to selected cell strings, a program inhibition voltage (for example, a power source voltage) is applied to unselected bit lines coupled to unselected cell strings. In the state in which the program permission voltage or the program inhibition voltage has been applied to the bit lines, a first program voltage Vpgm1 which gradually rises is applied to a selected word line (for example, WLn), and a ninth pass voltage Vpass9 which gradually rises is applied to the remaining unselected word lines WLn−k to WLn−1 and WLn+1 to WLn+k. Here, an increment of the ninth pass voltage Vpass9 is smaller than an increment of the first program voltage Vpgm1. The reason why the ninth pass voltage Vpass9 which gradually rises is applied to the remaining unselected word lines WLn−k to WLn−1 and WLn+1 to WLn+k as described above is to prevent unselected memory cells, included in the unselected cell strings, from being erased owing to the first program voltage Vpgm1 which gradually rises. That is, since the program inhibition voltage Vcc is applied to the bit lines coupled to the unselected cell strings, channel boosting is generated owing to the program inhibition voltage and the voltage applied to the word lines WLn−k to WLn+k. When a gradually rising voltage, such as the ninth pass voltage Vpass9, is applied, the potential of a channel can be raised because channel boosting is generated more efficiently.

At the early stage of the program operation, a difference between the first program voltage Vpgm1 and the ninth pass voltage Vpass9 is smaller than a Critical voltage Difference (CD). Accordingly, the first program voltage Vpgm1 which gradually rises is applied to the selected word line WLn coupled to the selected memory cells Fn, the ninth pass voltage Vpass9 is applied to the remaining unselected word lines WLn−k to WLn−1 and WLn+1 to WLn+k. The CD refers to a maximum voltage difference at which the first unselected memory cells Fn−1 and Fn+1 adjacent to the selected memory cell Fn are not programmed under the influence of the first program voltage Vpgm1 when the selected memory cell Fn is programmed. The CD may vary according to a semiconductor device and may be calculated by testing the semiconductor device. In an embodiment of the present invention, it is assumed that the CD is 7.5 V.

If the first program voltage Vpgm1 applied to the selected word line WLn is 12 V and the ninth pass voltage Vpass9 is 7 V, a difference between the first program voltage Vpgm1 and the ninth pass voltage Vpass9 is 5 V and is lower than the CD. In this case, the first unselected memory cells Fn−1 and Fn+1 adjacent to the selected memory cell Fn are not influenced by the first program voltage Vpgm1, and thus the ninth pass voltage Vpass9 is applied to all the unselected word lines WLn−k to WLn−1 and WLn+1 to WLn+k. That is, when the threshold voltages of the selected memory cells Fn do not reach a target voltage and until a difference between the first program voltage Vpgm1 and the ninth pass voltage Vpass9 reaches the CD, the first program voltage Vpgm1 and the ninth pass voltage Vpass9 are gradually raised in proportion to the number of first program voltages Vpgm1.

When a difference between the first program voltage Vpgm1 and the ninth pass voltage Vpass9 reaches the CD while performing the program operation by applying the selected word line WLn with the first program voltage Vpgm1 which gradually rises, a second program voltage Vpgm2 having a constant level instead of the first program voltage Vpgm1 is applied to the selected word line WLn. That is, when a difference between the first program voltage Vpgm1 and the ninth pass voltage Vpass9 reaches the CD, the first program voltage Vpgm1 is no longer raised, and the second program voltage Vpgm2 having a constant level is applied. Accordingly, the second program voltage Vpgm2 does not have a step voltage.

When the second program voltage Vpgm2 having a constant level is applied to the selected word line WLn, the program efficiency of the selected memory cells coupled to the selected word line WLn may deteriorate. In order to compensate for the deteriorated program efficiency, a second pass voltage Vpass2 which gradually rises is applied to the first unselected word lines WLn−1 and WLn+1 adjacent to both ends of the selected word line WLn. That is, although the second program voltage Vpgm2 having a constant level is applied to the selected word line WLn, when the second pass voltage Vpass2 which gradually rises is applied to the first unselected word lines WLn−1 and WLn+1, the deterioration of the efficiency of the program operation due to the second program voltage Vpgm2 having a constant level can be prevented under the influence of the second pass voltage Vpass2. The step-up voltage of the second pass voltage Vpass2 may be set identically with the step-up voltage of the first program voltage Vpgm1. For example, if the step-up voltage of the first program voltage Vpgm1 is 0.5 V, the step-up voltage of the second pass voltage Vpass2 may also be 0.5 V.

In particular, while the second pass voltage Vpass2 which gradually rises is applied to the first unselected word lines WLn−1 and WLn+1, the threshold voltages of the first unselected memory cells Fn−1 and Fn+1 coupled to the first unselected word lines WLn−1 and WLn+1 and the threshold voltages of the second unselected memory cells Fn−2 and Fn+2 adjacent to the first unselected memory cells Fn−1 and Fn+1 may decrease. In order to prevent the decrease, a third pass voltage Vpass3 lower than the ninth pass voltage Vpass9 by the CD is applied to the second unselected word lines WLn−2 and WLn+2 adjacent to the first unselected word lines WLn−1 and WLn+1. The ninth pass voltage Vpass9 continues to be applied to the remaining unselected word lines WLn−k to WLn−3 and WLn+3 to WLn+k other than the first unselected word lines WLn−1 and WLn+1 and the second unselected word lines WLn−2 and WLn+2. That is, in order to prevent a decrease in the threshold voltages of the first and the second unselected memory cells Fn−1 and Fn+1 and Fn−2 and Fn+2 owing to the second pass voltage Vpass2 which gradually rises, the level of the ninth pass voltage Vpass9 applied to the second unselected word lines WLn−2 and WLn+2 coupled to the second unselected memory cells Fn−2 and Fn+2, respectively, is lowered by the CD, and the third pass voltage Vpass3 which gradually rises is then applied to the second unselected word lines WLn−2 and WLn+2. For example, if the step voltage of the first program voltage Vpgm1 is 0.5 V, each of the second pass voltage Vpass2 and the third pass voltage Vpass3 may also be gradually raised by 0.5 V.

As described above, an excessive increase of a program voltage applied to the selected word line WLn can be prevented by lowering a maximum value of the program voltage, and the occurrence of leakage of the unselected memory cells can be prevented by preventing an excessive rise of the voltage. Furthermore, while a program operation is performed using a program voltage having a constant level, a pass voltage applied to the first unselected word lines WLn−1 and WLn+1 adjacent to the selected word line WLn is gradually raised. As a result, the deterioration of program efficiency of selected memory cells can be prevented. The third pass voltage Vpass3 lower than the second pass voltage Vapss2 by the CD is applied to the second unselected word lines WLn−2 and WLn+2 in order to prevent a decrease in the threshold voltages of the first and the second unselected memory cells Fn−1 and Fn+1 and Fn−2 and Fn+2.

Figure 11:
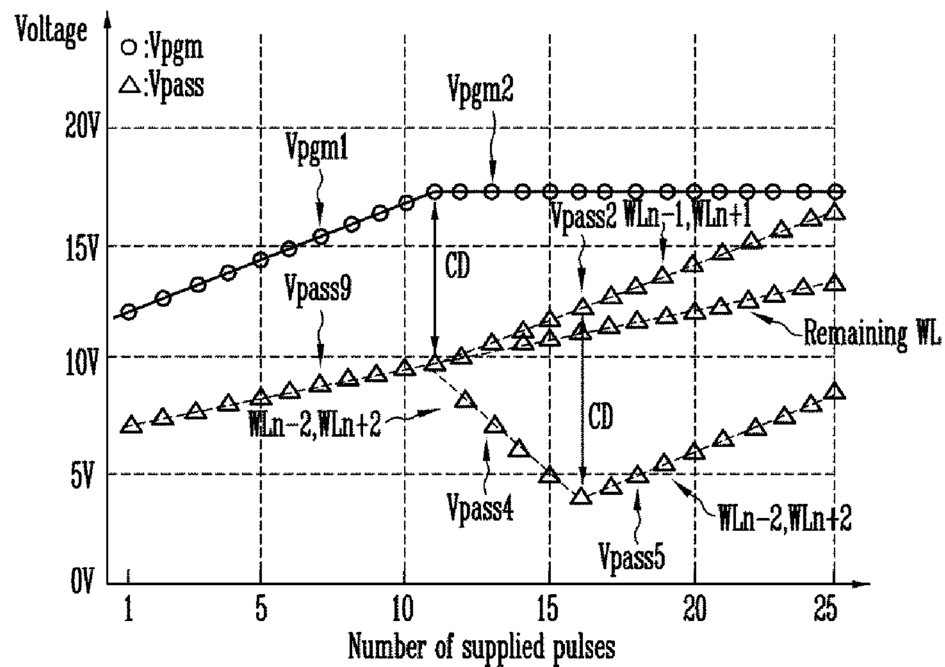
FIG. 11 is a graph illustrating a program method according to an embodiment of the present invention.

FIG. 11 is a graph illustrating a program method according to an embodiment of the present invention.

Referring to FIGS. 11 and 3, a program operation is performed according to an ISPP method of gradually raising a program voltage Vpgm. In the program operation, a program permission voltage (for example, a ground voltage) is applied to selected bit lines coupled to selected cell strings, a program inhibition voltage (for example, a power source voltage) is applied to unselected bit lines coupled to unselected cell strings. In the state in which the program permission voltage or the program inhibition voltage has been applied to the bit lines, a first program voltage Vpgm1 which gradually rises is applied to a selected word line (for example, WLn), and a ninth pass voltage Vpass9 which gradually rises is applied to the remaining unselected word lines WLn−k to WLn−1 and WLn+1 to WLn+k. Here, an increment of the ninth pass voltage Vpass9 is smaller than an increment of the first program voltage Vpgm1. The reason why the ninth pass voltage Vpass9 which gradually rises is applied to the remaining unselected word lines WLn−k to WLn−1 and WLn+1 to WLn+k as described above is to prevent unselected memory cells, included in the unselected cell strings, from being erased owing to the first program voltage Vpgm1 which gradually rises. That is, since the program inhibition voltage Vcc is applied to the bit lines coupled to the unselected cell strings, channel boosting is generated owing to the program inhibition voltage and the voltage applied to the word lines WLn−k to WLn+k. When a gradually rising voltage, such as the ninth pass voltage Vpass9, is applied, the potential of a channel can be raised because channel boosting is generated more efficiently.

At the early stage of the program operation, a difference between the first program voltage Vpgm1 and the ninth pass voltage Vpass9 is smaller than a Critical voltage Difference (CD). Accordingly, the first program voltage Vpgm1 which gradually rises is applied to the selected word line WLn coupled to the selected memory cells Fn, the ninth pass voltage Vpass9 is applied to the remaining unselected word lines WLn−k to WLn−1 and WLn+1 to WLn+k. The CD refers to a maximum voltage difference at which the first unselected memory cells Fn−1 and Fn+1 adjacent to the selected memory cell Fn are not erased under the influence of the first program voltage Vpgm1 when the selected memory cell Fn is programmed. The CD may vary according to a semiconductor device and may be calculated by testing the semiconductor device. In an embodiment of the present invention, it is assumed that the CD is 7.5 V.

If the first program voltage Vpgm1 applied to the selected word line WLn is 12 V and the ninth pass voltage Vpass9 is 7 V, a difference between the first program voltage Vpgm1 and the ninth pass voltage Vpass9 is 5 V and is lower than the CD. In this case, the first unselected memory cells Fn−1 and Fn+1 adjacent to the selected memory cell Fn are not influenced by the first program voltage Vpgm1, and thus the ninth pass voltage Vpass9 is applied to all the unselected word lines WLn−1 to WLn+k and WLn+1 to WLn+k. That is, when the threshold voltages of the selected memory cells Fn do not reach a target voltage and until a difference between the first program voltage Vpgm1 and the ninth pass voltage Vpass9 reaches the CD, the first program voltage Vpgm1 and the ninth pass voltage Vpass9 are gradually raised in proportion to the number of first program voltages Vpgm1.

When a difference between the first program voltage Vpgm1 and the ninth pass voltage Vpass9 reaches the CD while performing the program operation by applying the selected word line WLn with the first program voltage Vpgm1 which gradually rises, a second program voltage Vpgm2 having a constant level instead of the first program voltage Vpgm1 is applied to the selected word line WLn. That is, when a difference between the first program voltage Vpgm1 and the ninth pass voltage Vpass9 reaches the CD, the first program voltage Vpgm1 is no longer raised, and the second program voltage Vpgm2 having a constant level is applied. Accordingly, the second program voltage Vpgm2 does not have a step voltage.

When the second program voltage Vpgm2 having a constant level is applied to the selected word line WLn, the program efficiency of the selected memory cells coupled to the selected word line WLn may deteriorate. In order to compensate for the deteriorated program efficiency, a second pass voltage Vpass2 which gradually rises is applied to the first unselected word lines WLn−1 and WLn+1 adjacent to both ends of the selected word line WLn. That is, although the second program voltage Vpgm2 having a constant level is applied to the selected word line WLn, when the second pass voltage Vpass2 which gradually rises is applied to the first unselected word lines WLn−1 and WLn+1, the potentials of the selected memory cells rise under the influence of the second pass voltage Vpass2. Accordingly, the deterioration of the efficiency of the program operation due to the second program voltage Vpgm2 having a constant level can be prevented. The step-up voltage of the second pass voltage Vpass2 may be set identically with the step voltage of the first program voltage Vpgm1. For example, if the step voltage of the first program voltage Vpgm1 is 0.5 V, the step-up voltage of the second pass voltage Vpass2 may also be 0.5 V.

When the second pass voltage Vpass2 which gradually rises is applied to the first unselected word lines WLn−1 and WLn+1, a fourth pass voltage Vpass4 which gradually drops is applied to the second unselected word lines WLn−2 and WLn+2 adjacent to the first unselected word lines WLn−1 and WLn+1. The ninth pass voltage Vpass9 continues to be applied to the remaining unselected word lines WLn−k to WLn−3 and WLn+3 to WLn+k other than the first unselected word lines WLn−1 and WLn+1 adjacent to the selected word line WLn and the second unselected word lines WLn−2 and WLn+2 adjacent to the first unselected word lines WLn−1 and WLn+1.

The fourth pass voltage Vpass4 is applied to the second unselected memory cells Fn−2 and Fn+2 adjacent to the first unselected memory cells Fn−1 and Fn+1, respectively. That is, in order to prevent a decrease in the threshold voltages of the first and the second unselected memory cells Fn−1, Fn+1, Fn−2 and Fn+2 due to the second pass voltage Vpass2 which gradually rises, the fourth pass voltage Vpass4 gradually dropping by a step-down voltage is applied to the second unselected word lines WLn−2 and WLn+2 coupled to the second unselected memory cells Fn−2 and Fn+2. The fourth pass voltage Vpass4 is described in detail below. If a coupling ratio due to a word line coupled to a selected memory cell is 0.6 and a coupling ratio due to a word line coupled to a memory cell adjacent to the selected memory cell is 0.15, a maximum step-down voltage of the fourth pass voltage Vpass4 is 0.5 V×(0.6/0.15)=2 V. Accordingly, the step-down voltage of the fourth pass voltage Vpass4 may be set within a range which is higher than the ground voltage 0 V, but lower than 2 V.

The second pass voltage Vpass2 gradually rises by the step-up voltage, and the fourth pass voltage Vpass4 gradually drops by the step-down voltage. Thus, before the program operation is completed, a difference between the second pass voltage Vpass2 and the fourth pass voltage Vpass4 may reach the CD. When a difference between the second pass voltage Vpass2 and the fourth pass voltage Vpass4 reaches the CD, a fifth pass voltage Vpass5 which gradually rises is applied to the second unselected word lines WLn−2 and WLn+2 to which the fourth pass voltage Vpass4 has been applied. That is, when a difference between the second pass voltage Vpass2 and the fourth pass voltage Vpass4 becomes the CD or higher, the threshold voltages of the memory cells Fn−1 and Fn+1 may decrease owing to the second pass voltage Vpass2 which gradually rises. In order to prevent the decrease, the fifth pass voltage Vpass5 gradually rising by a step-up voltage is applied to the second unselected word lines WLn−2 and WLn+2. While the second or fifth pass voltage Vpass2 or Vpass5 is applied to the first and the second the unselected word lines WLn−1 and WLn+1 and WLn−2 and WLn+2, the ninth pass voltage Vpass9 continues to be applied to the remaining unselected word lines WLn−3 to WLn−k and WLn+3 to WLn+k.

As described above, an excessive increase of a program voltage applied to the selected word line WLn can be prevented by lowering a maximum value of the program voltage, and the occurrence of leakage of the unselected memory cells can be prevented by preventing an excessive rise of the voltage. Furthermore, while a program operation is performed using a program voltage having a constant level, a pass voltage applied to the first unselected word lines WLn−1 and WLn+1 adjacent to the selected word line WLn is gradually raised. As a result, the deterioration of program efficiency of selected memory cells can be prevented. Furthermore, by controlling the pass voltages applied to the second and the third unselected word lines WLn−2, WLn+2, WLn−3 and WLn+3, a shift in the threshold voltages of the first to third unselected memory cells Fn−3 to Fn−1 and Fn+1 to Fn+3 due to the second pass voltage Vpass2 applied to the first unselected word lines WLn−1 and WLn+1 can be prevented.

Figure 12:
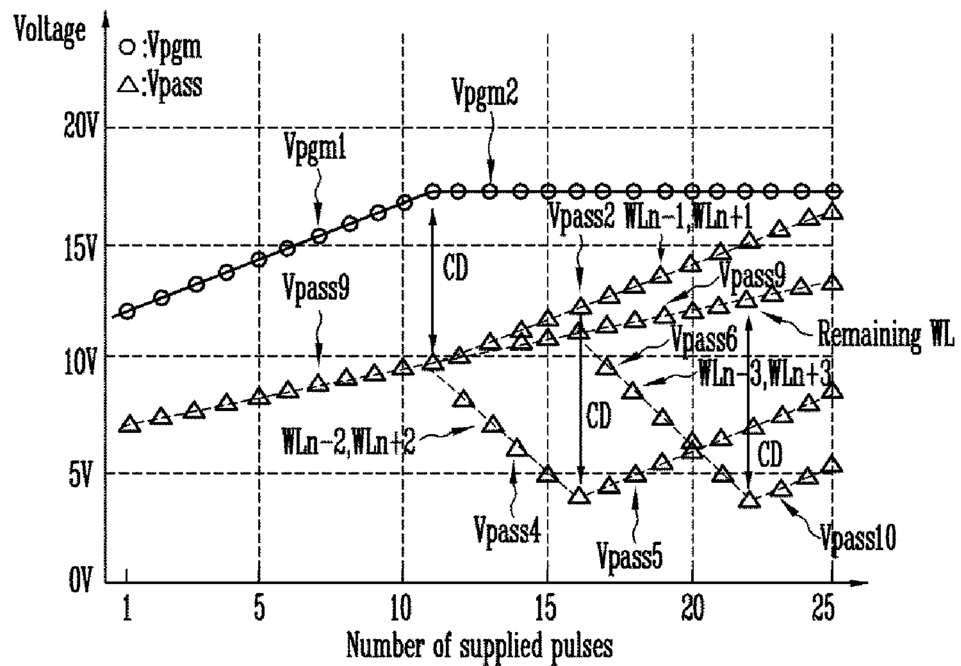
FIG. 12 is a graph illustrating a program method according to an embodiment of the present invention.

FIG. 12 is a graph illustrating a program method according to an embodiment of the present invention.

Referring to FIGS. 12 and 3, a program operation is performed according to an ISPP method of gradually raising a program voltage Vpgm. In the program operation, a program permission voltage (for example, a ground voltage) is applied to selected bit lines coupled to selected cell strings, a program inhibition voltage (for example, a power source voltage) is applied to unselected bit lines coupled to unselected cell strings. In the state in which the program permission voltage or the program inhibition voltage has been applied to the bit lines, a first program voltage Vpgm1 which gradually rises is applied to a selected word line (for example, WLn), and a ninth pass voltage Vpass9 which gradually rises is applied to the remaining unselected word lines WLn−k to WLn−1 and WLn+1 to WLn+k. Here, an increment of the ninth pass voltage Vpass9 is smaller than an increment of the first program voltage Vpgm1. The reason why the ninth pass voltage Vpass9 which gradually rises is applied to the remaining unselected word lines WLn−k to WLn−1 and WLn+1 to WLn+k as described above is to prevent unselected memory cells, included in the unselected cell strings, from being programmed owing to the first program voltage Vpgm1 which gradually rises. That is, since the program inhibition voltage Vcc is applied to the bit lines coupled to the unselected cell strings, channel boosting is generated owing to the program inhibition voltage and the voltage applied to the word lines WLn−k to WLn+k. When a gradually rising voltage, such as the ninth pass voltage Vpass9, is applied, the potential of a channel can be raised because channel boosting is generated more efficiently.

At the early stage of the program operation, a difference between the first program voltage Vpgm1 and the ninth pass voltage Vpass9 is smaller than a Critical voltage Difference (CD). Accordingly, the first program voltage Vpgm1 which gradually rises is applied to the selected word line WLn coupled to the selected memory cells Fn, the ninth pass voltage Vpass9 is applied to the remaining unselected word lines WLn−k to WLn−1 and WLn+1 to WLn+k. The CD refers to a maximum voltage difference at which the first unselected memory cells Fn−1 and Fn+1 adjacent to the selected memory cell Fn are not erased under the influence of the first program voltage Vpgm1 when the selected memory cell Fn is programmed. The CD may vary according to a semiconductor device and may be calculated by testing the semiconductor device. In an embodiment of the present invention, it is assumed that the CD is 7.5 V.

If the first program voltage Vpgm1 applied to the selected word line WLn is 12 V and the ninth pass voltage Vpass9 is 7 V, a difference between the first program voltage Vpgm1 and the ninth pass voltage Vpass9 is 5 V and is lower than the CD. In this case, the first unselected memory cells Fn−1 and Fn+1 adjacent to the selected memory cell Fn are not influenced by the first program voltage Vpgm1, and thus the ninth pass voltage Vpass9 is applied to all the unselected word lines WLn−k to WLn−1 and WLn+1 to WLn+k. That is, when the threshold voltages of the selected memory cells Fn do not reach a target voltage and until a difference between the first program voltage Vpgm1 and the ninth pass voltage Vpass9 reaches the CD, the first program voltage Vpgm1 and the ninth pass voltage Vpass9 are gradually raised in proportion to the number of first program voltages Vpgm1.

When a difference between the first program voltage Vpgm1 and the ninth pass voltage Vpass9 reaches the CD while performing the program operation by applying the selected word line WLn with the first program voltage Vpgm1 which gradually rises, a second program voltage Vpgm2 having a constant level instead of the first program voltage Vpgm1 is applied to the selected word line WLn. That is, when a difference between the first program voltage Vpgm1 and the ninth pass voltage Vpass9 reaches the CD, the first program voltage Vpgm1 is no longer raised, and the second program voltage Vpgm2 having a constant level is applied. Accordingly, the second program voltage Vpgm2 does not have a step voltage.

When the second program voltage Vpgm2 having a constant level is applied to the selected word line WLn, the program efficiency of the selected memory cells coupled to the selected word line WLn may deteriorate. In order to compensate for the deteriorated program efficiency, a second pass voltage Vpass2 which gradually rises is applied to the first unselected word lines WLn−1 and WLn+1 adjacent to both ends of the selected word line WLn. That is, although the second program voltage Vpgm2 having a constant level is applied to the selected word line WLn, when the second pass voltage Vpass2 which gradually rises is applied to the first unselected word lines WLn−1 and WLn+1, the potentials of the selected memory cells rise under the influence of the second pass voltage Vpass2. Accordingly, the deterioration of the efficiency of the program operation due to the second program voltage Vpgm2 having a constant level can be prevented. The step-up voltage of the second pass voltage Vpass2 may be set identically with the step voltage of the first program voltage Vpgm1. For example, if the step voltage of the first program voltage Vpgm1 is 0.5 V, the step-up voltage of the second pass voltage Vpass2 may also be 0.5 V.

When the second pass voltage Vpass2 which gradually rises is applied to the first unselected word lines WLn−1 and WLn+1, a fourth pass voltage Vpass4 which gradually drops is applied to the second unselected word lines WLn−2 and WLn+2 adjacent to the first unselected word lines WLn−1 and WLn+1. The ninth pass voltage Vpass9 continues to be applied to the remaining unselected word lines WLn−k to WLn−3 and WLn+3 to WLn+k other than the first unselected word lines WLn−1 and WLn+1 adjacent to the selected word line WLn and the second unselected word lines WLn−2 and WLn+2 adjacent to the first unselected word lines WLn−1 and WLn+1.

The fourth pass voltage Vpass4 is applied to the second unselected memory cells Fn−2 and Fn+2 adjacent to the first unselected memory cells Fn−1 and Fn+1, respectively. That is, in order to prevent a decrease in the threshold voltages of the first and the second unselected memory cells Fn−1, Fn+1, Fn−2 and Fn+2 due to the second pass voltage Vpass2 which gradually rises, the fourth pass voltage Vpass4 gradually dropping by a step-down voltage is applied to the second unselected word lines WLn−2 and WLn+2 coupled to the second unselected memory cells Fn−2 and Fn+2. The fourth pass voltage Vpass4 is described in detail below. If a coupling ratio due to a word line coupled to a selected memory cell is 0.6 and a coupling ratio due to a word line coupled to a memory cell adjacent to the selected memory cell is 0.15, a maximum step-down voltage of the fourth pass voltage Vpass4 is $0.5\ V \times (0.6/0.15) = 2\ V$. Accordingly, the step-down voltage of the fourth pass voltage Vpass4 may be set within a range which is higher than the ground voltage 0 V, but lower than 2 V.

The second pass voltage Vpass2 gradually rises, and the fourth pass voltage Vpass4 gradually drops. Thus, before the program operation is completed, a difference between the second pass voltage Vpass2 and the fourth pass voltage Vpass4 may reach the CD. From this time, a fifth pass voltage Vpass5 which gradually rises is applied to the second unselected word lines WLn−2 and WLn+2 to which the fourth pass voltage Vpass4 had been applied, and a sixth pass voltage Vpass6 which gradually drops is applied to the third unselected word lines WLn−3 and WLn+3 adjacent to the second unselected word lines WLn−2 and WLn+2. That is, when a difference between the second pass voltage Vpass2 and the fourth pass voltage Vpass4 becomes the CD or higher, the threshold voltages of the first unselected memory cells Fn−1 and Fn+1 may decrease owing to the second pass voltage Vpass2 which gradually rises. In order to prevent the decrease, the fifth pass voltage Vpass5 which gradually rises is applied to the second unselected word lines WLn−2 and WLn+2. When the second, fifth, or sixth pass voltage Vpass2, Vpass5, or Vpass6 is applied to the first to third unselected word lines WLn−3 to WLn−1 and WLn+1 to WLn+3 sequentially adjacent to the selected word line WLn, the first pass voltage Vpass having a fixed level continues to be applied to the remaining unselected word lines WLn−k to WLn−4 and WLn+4 to WLn+k.

While the sixth pass voltage Vpass6 which gradually drops is applied to the third unselected word lines WLn−3 and WLn+3, a difference between the sixth pass voltage Vpass6 and the ninth pass voltage Vpass9 may reach the CD. From this time, in order to prevent a further increase in the voltage difference between the third unselected word lines WLn−3 and WLn+3 and the fourth word lines WLn−4 and WLn+4, a tenth pass voltage Vpass10 which gradually rises is applied to the third unselected word lines WLn−3 and WLn+3 having potentials dropped to the sixth pass voltage Vpass6.

As described above, an excessive increase of a program voltage applied to the selected word line WLn can be prevented by lowering a maximum value of the program voltage, and the occurrence of leakage of the unselected memory cells can be prevented by preventing an excessive rise of the voltage. Furthermore, a shift in the threshold voltages of the first to third memory cells Fn−3 to Fn−1 and Fn+1 to Fn+3 adjacent to the selected memory cell Fn can be prevented in the program operation of the selected memory cell Fn by controlling the pass voltages applied to the first to third unselected word lines WLn−1 to WLn−3 and WLn+1 to WLn+3 adjacent to the selected word line WLn.

Figure 13:
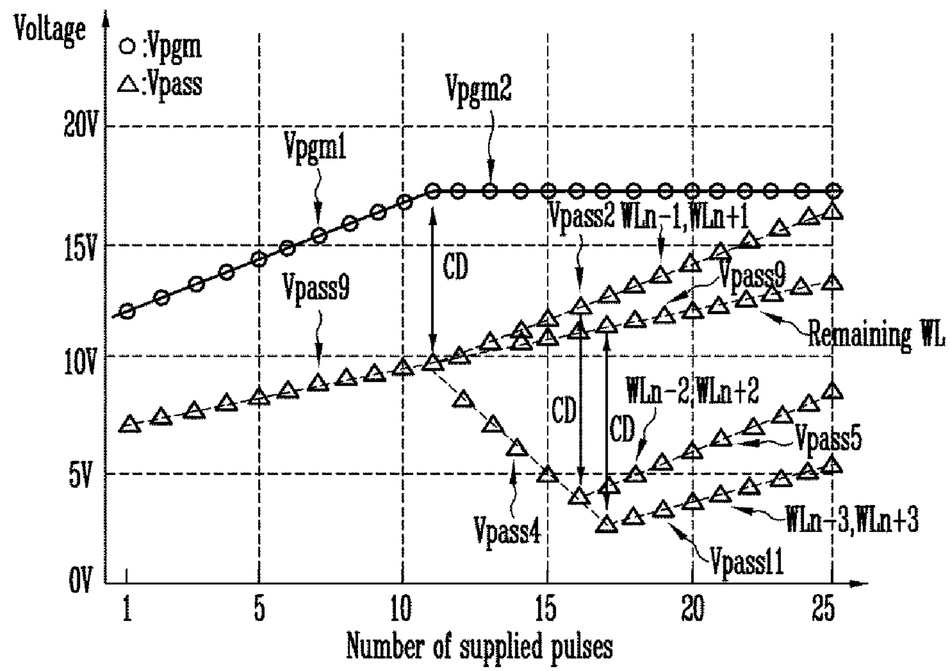
FIG. 13 is a graph illustrating a program method according to an embodiment of the present invention.

FIG. 13 is a graph illustrating a program method according to an embodiment of the present invention.

Referring to FIGS. 13 and 3, a program operation is performed according to an ISPP method of gradually raising a program voltage Vpgm. In the program operation, a program permission voltage (for example, a ground voltage) is applied to selected bit lines coupled to selected cell strings, a program inhibition voltage (for example, a power source voltage) is applied to unselected bit lines coupled to unselected cell strings. In the state in which the program permission voltage or the program inhibition voltage has been applied to the bit lines, a first program voltage Vpgm1 which gradually rises is applied to a selected word line (for example, WLn), and a ninth pass voltage Vpass9 which gradually rises is applied to the remaining unselected word lines WLn−k to WLn−1 and WLn+1 to WLn+k. Here, an increment of the ninth pass voltage Vpass9 is smaller than an increment of the first program voltage Vpgm1. The reason why the ninth pass voltage Vpass9 which gradually rises is applied to the remaining unselected word lines WLn−k to WLn−1 and WLn+1 to WLn+k as described above is to prevent unselected memory cells, included in the unselected cell strings, from being erased owing to the first program voltage Vpgm1 which gradually rises. That is, since the program inhibition voltage Vcc is applied to the bit lines coupled to the unselected cell strings, channel boosting is generated owing to the program inhibition voltage and the voltage applied to the word lines WLn−k to WLn+k. When a gradually rising voltage, such as the ninth pass voltage Vpass9, is applied, the potential of a channel can be raised because channel boosting is generated more efficiently.

At the early stage of the program operation, a difference between the first program voltage Vpgm1 and the ninth pass voltage Vpass9 is smaller than a Critical voltage Difference (CD). Accordingly, the first program voltage Vpgm1 which gradually rises is applied to the selected word line WLn coupled to the selected memory cells Fn, the ninth pass voltage Vpass9 is applied to the remaining unselected word lines WLn−k to WLn−1 and WLn+1 to WLn+k. The CD refers to a maximum voltage difference at which the first unselected memory cells Fn−1 and Fn+1 adjacent to the selected memory cell Fn are not erased under the influence of the first program voltage Vpgm1 when the selected memory cell Fn is programmed. The CD may vary according to a semiconductor device and may be calculated by testing the semiconductor device. In an embodiment of the present invention, it is assumed that the CD is 7.5 V.

If the first program voltage Vpgm1 applied to the selected word line WLn is 12 V and the ninth pass voltage Vpass9 is 7 V, a difference between the first program voltage Vpgm1 and the ninth pass voltage Vpass9 is 5 V and is lower than the CD. In this case, the first unselected memory cells Fn−1 and Fn+1 adjacent to the selected memory cell Fn are not influenced by the first program voltage Vpgm1, and thus the ninth pass voltage Vpass9 is applied to all the unselected word lines WLn−k to WLn−1 and WLn+1 to WLn+k. That is, when the threshold voltages of the selected memory cells Fn do not reach a target voltage and until a difference between the first program voltage Vpgm1 and the ninth pass voltage Vpass9 reaches the CD, the first program voltage Vpgm1 and the ninth pass voltage Vpass9 are gradually raised in proportion to the number of first program voltages Vpgm1.

When a difference between the first program voltage Vpgm1 and the ninth pass voltage Vpass9 reaches the CD while performing the program operation by applying the selected word line WLn with the first program voltage Vpgm1 which gradually rises, a second program voltage Vpgm2 having a constant level instead of the first program voltage Vpgm1 is applied to the selected word line WLn. That is, when a difference between the first program voltage Vpgm1 and the ninth pass voltage Vpass9 reaches the CD, the first program voltage Vpgm1 is no longer raised, and the second program voltage Vpgm2 having a constant level is applied. Accordingly, the second program voltage Vpgm2 does not have a step voltage.

When the second program voltage Vpgm2 having a constant level is applied to the selected word line WLn, the program efficiency of the selected memory cells coupled to the selected word line WLn may deteriorate. In order to compensate for the deteriorated program efficiency, a second pass voltage Vpass2 which gradually rises is applied to the first unselected word lines WLn−1 and WLn+1 adjacent to both ends of the selected word line WLn. That is, although the second program voltage Vpgm2 having a constant level is applied to the selected word line WLn, when the second pass voltage Vpass2 which gradually rises is applied to the first unselected word lines WLn−1 and WLn+1, the potentials of the selected memory cells rise under the influence of the second pass voltage Vpass2. Accordingly, the deterioration of the efficiency of the program operation due to the second program voltage Vpgm2 having a constant level can be prevented. The step-up voltage of the second pass voltage Vpass2 may be set identically with the step voltage of the first program voltage Vpgm1. For example, if the step voltage of the first program voltage Vpgm1 is 0.5 V, the step-up voltage of the second pass voltage Vpass2 may also be 0.5 V.

When the second pass voltage Vpass2 which gradually rises is applied to the first unselected word lines WLn−1 and WLn+1, a fourth pass voltage Vpass4 which gradually drops is applied to the second and the third unselected word lines WLn−2, WLn+2, WLn−3 and WLn+3 sequentially adjacent to the first unselected word lines WLn−1 and WLn+1. The ninth pass voltage Vpass9 continues to be applied to the remaining unselected word lines WLn−k to WLn−4 and WLn+4 to WLn+k other than the first unselected word lines WLn−1 and WLn+1 adjacent to the selected word line WLn and the second and the third unselected word lines WLn−2, WLn+2, WLn−3 and WLn+3 adjacent to the first unselected word lines WLn−1 and WLn+1. That is, in order to prevent a decrease in the threshold voltages of the first and the second unselected memory cells Fn−1, Fn+1, Fn−2 and Fn+2 due to the second pass voltage Vpass2 which gradually rises, the fourth pass voltage Vpass4 gradually dropping by a step-down voltage is applied to the second and the third unselected word lines WLn−2, WLn+2, WLn−3 and WLn+3 coupled to the second unselected memory cells Fn−2 and Fn+2. The fourth pass voltage Vpass4 is described in detail below. If a coupling ratio due to a word line coupled to a selected memory cell is 0.6 and a coupling ratio due to a word line coupled to a memory cell adjacent to the selected memory cell is 0.15, a maximum step-down voltage of the fourth pass voltage Vpass4 is 0.5 V×(0.6/0.15)=2 V. Accordingly, the step-down voltage of the fourth pass voltage Vpass4 may be set within a range which is higher than the ground voltage 0 V, but lower than 2 V.

The second pass voltage Vpass2 gradually rises, and the fourth pass voltage Vpass4 gradually drops. Thus, before the program operation is completed, a difference between the second pass voltage Vpass2 and the fourth pass voltage Vpass4 may reach the CD. From this time, a fifth pass voltage Vpass5 which gradually rises is applied to the second unselected word lines WLn−2 and WLn+2 to which the fourth pass voltage Vpass4 had been applied, and the fourth pass voltage Vpass4 which gradually drops continues to be applied to the third unselected word lines WLn−3 and WLn+3 adjacent to the second unselected word lines WLn−2 and WLn+2. That is, the second unselected memory cells Fn−2 and Fn+2 are more influenced by the second pass voltage Vpass2, applied to the first unselected word lines WLn−1 and WLn+1, than the third unselected memory cells Fn−3 and Fn+3. Thus, the potentials of the second unselected word lines WLn−2 and WLn+2 coupled to the second unselected memory cells Fn−2 and Fn+2 are raised in order to reduce the influence of the second pass voltage Vpass2. The ninth pass voltage Vpass9 continues to be applied to the remaining unselected word lines WLn−k to WLn−4 and WLn+4 to WLn+k.

When the fourth pass voltage Vpass4 applied to the third unselected word lines WLn−3 and WLn+3 drops and thus a difference between the ninth pass voltage Vpass9 and the fourth pass voltage Vpass4 reaches the CD, an eleventh pass voltage Vpass11 which gradually rises is applied to the third unselected word lines WLn−3 and WLn+3. Here, an increment of the eleventh pass voltage Vpass11 is identical with an increment of the ninth pass voltage Vpass9.

As described above, an excessive increase of a program voltage applied to the selected word line WLn can be prevented by lowering a maximum value of the program voltage, and the occurrence of leakage of the unselected memory cells can be prevented by preventing an excessive rise of the voltage. Furthermore, a shift in the threshold voltages of the first to third memory cells Fn−3 to Fn−1 and Fn+1 to Fn+3 adjacent to the selected memory cell Fn can be prevented in the program operation of the selected memory cell Fn by controlling the pass voltages applied to the first to third unselected word lines WLn−3 to WLn−1 and WLn+1 to WLn+3 adjacent to the selected word line WLn.

In accordance with this invention, in a program operation, unselected memory cells adjacent to a selected memory cell can be prevented from being erased. In particular, the reliability of a semiconductor device can be improved because the threshold voltage of a memory cell on which program has been completed is prevented from decreasing. Furthermore, leakage that may occur in an unselected memory cells can be prevented because the level of a gradually rising program voltage keeps constant after the program voltage reaches a specific level.

What is claimed is:

1. A method of operating a semiconductor device, comprising:

programming selected memory cells by applying a first program voltage, which gradually rises, to a selected word line and applying a first pass voltage, which is constant, to remaining unselected word lines; and programming the selected memory cells while applying a second program voltage, which is constant, to the selected word line and applying a second pass voltage, which gradually rises, to first unselected word lines adjacent to the selected word line, when a difference between the first program voltage and the first pass voltage reaches a critical voltage difference.

2. The method of claim 1, further comprising programming the selected memory cells while applying a third pass voltage having a lower voltage level than the first pass voltage by the critical voltage difference to second unselected word lines adjacent to the first unselected word lines, respectively, when applying the second pass voltage to the first unselected word lines.

3. The method of claim 2, wherein the third pass voltage gradually rises in proportion to the second pass voltage.

4. The method of claim 1, further comprising:

applying a fourth pass voltage, which gradually drops, to second unselected word lines adjacent to the first unselected word lines, respectively, when applying the second pass voltage to the first unselected word lines; and applying a fifth pass voltage, gradually rising in proportion to the second pass voltage, to the second unselected word lines, when a difference between the fourth pass voltage and the second pass voltage reaches the critical voltage difference.

5. The method of claim 4, further comprising:

applying a sixth pass voltage, which gradually drops, to third unselected word lines adjacent to the second unselected word lines, respectively, when applying the fifth pass voltage to the second unselected word lines; and applying a seventh pass voltage, which is constant, to the second unselected word lines, when a difference between the sixth pass voltage and the first pass voltage reaches the critical voltage difference.

6. The method of claim 1, further comprising:

applying a fourth pass voltage, which gradually drops, to second and third unselected word lines sequentially adjacent to the first unselected word lines, when applying the second pass voltage to the first unselected word lines; and applying a fifth pass voltage, gradually rising in proportion to the second pass voltage, to the second unselected word lines, and continuing to apply the fourth pass voltage to the third unselected word lines until a difference between the first pass voltage and the fourth pass voltage reaches the critical voltage difference, when a difference between the fourth pass voltage and the second pass voltage reaches the critical voltage difference.

7. The method of claim 6, further comprising applying an eighth pass voltage, which is constant, to the second unselected word lines, when a difference between the first pass voltage and the fourth pass voltage applied to the third unselected word lines reaches the critical voltage difference.

8. A method of operating a semiconductor device, comprising:

programming selected memory cells coupled to a selected word line by applying a first program voltage, gradually rising by a first step voltage, to the selected word line and by applying a ninth pass voltage, gradually rising by a lower level than the first program voltage, to remaining unselected word lines; and programming the selected memory cells while applying a second program voltage, which is constant, to the selected word line and applying a second pass voltage, gradually rising by the first step voltage, to first unselected word lines adjacent to the selected word line, when a difference between the first program voltage and the ninth pass voltage reaches a critical voltage difference while programming the selected memory cells.

9. The method of claim 8, further comprising applying a third pass voltage, having a lower potential than the ninth pass voltage by the critical voltage difference, to second unselected word lines adjacent to the first unselected word lines, respectively, when applying the second pass voltage to the first unselected word lines.

10. The method of claim 9, wherein the third pass voltage gradually rises in proportion to the second pass voltage.

11. The method of claim 8, further comprising:

applying a fourth pass voltage, which gradually drops, to second unselected word lines adjacent to the first unselected word lines, respectively, when applying the second pass voltage to the first unselected word lines; and applying a fifth pass voltage, gradually rising in proportion to the second pass voltage, to the second unselected word lines, when a difference between the fourth pass voltage and the second pass voltage reaches the critical voltage difference.

12. The method of claim 11, further comprising:

applying a sixth pass voltage, which gradually drops, to third unselected word lines adjacent to the second unselected word lines, respectively, when applying the fifth pass voltage to the second unselected word lines; and applying a tenth pass voltage, gradually rising in proportion to the ninth pass voltage, to the third unselected word lines, when a difference between the sixth pass voltage and the ninth pass voltage reaches the critical voltage difference.

13. The method of claim 8, further comprising:

applying a fourth pass voltage, which gradually drops, to second and third unselected word lines sequentially adjacent to the first unselected word lines, when applying the second pass voltage to the first unselected word lines; and applying a fifth pass voltage, gradually rising in proportion to the second pass voltage, to the second unselected word lines, and continuing to apply the fourth pass voltage to the third unselected word lines until a difference between the ninth pass voltage and the fourth pass voltage reaches the critical voltage difference, when a difference between the fourth pass voltage and the second pass voltage reaches the critical voltage difference.

14. The method of claim 13, further comprising applying an eleventh pass voltage, gradually rising in proportion to the ninth pass voltage, to the third unselected word lines when a difference between the ninth pass voltage and the fourth pass voltage applied to the third unselected word lines reaches the critical voltage difference.

* * * * *